(12) United States Patent
Matsumura et al.

(10) Patent No.: US 8,975,098 B2
(45) Date of Patent: Mar. 10, 2015

(54) SEMICONDUCTOR LIGHT EMITTING ELEMENT AND METHOD FOR MANUFACTURING THE SAME

(71) Applicant: Nichia Corporation, Anan-shi, Tokushima (JP)

(72) Inventors: Hiroaki Matsumura, Tokushima (JP); Takashi Abe, Anan (JP); Kyosuke Nakagawa, Tokushima (JP)

(73) Assignee: Nichia Corporation, Anan-Shi (JP)

( * ) Notice: Subject to any disclaimer, the term of this patent is extended or adjusted under 35 U.S.C. 154(b) by 48 days.

(21) Appl. No.: 13/944,130

(22) Filed: Jul. 17, 2013

(65) Prior Publication Data

US 2014/0024150 A1 Jan. 23, 2014

(30) Foreign Application Priority Data

Jul. 18, 2012 (JP) .................................. 2012-159152

(51) Int. Cl.
*H01L 33/40* (2010.01)
*H01L 33/38* (2010.01)
*H01L 33/44* (2010.01)

(52) U.S. Cl.
CPC ................ *H01L 33/40* (2013.01); *H01L 33/38* (2013.01); *H01L 33/44* (2013.01); *H01L 2933/0016* (2013.01)
USPC ................... 438/22; 438/25; 438/26; 438/27; 438/29; 257/13; 257/98; 257/99

(58) Field of Classification Search
CPC ......... H01L 33/40; H01L 33/38; H01L 33/44; H01L 2933/0016; H01L 33/405; H01L 33/62; H01L 2224/16; H01L 2924/01046; H01L 2924/01078; H01L 2924/01079; H01L 2924/3025; H01L 21/76254
USPC ........... 438/22, 25, 26, 27, 29; 257/13, 98, 99
See application file for complete search history.

(56) References Cited

U.S. PATENT DOCUMENTS

| | | | |
|---|---|---|---|
| 2007/0057271 A1* | 3/2007 | Schiaffino et al. | ............... 257/99 |
| 2009/0221131 A1 | 9/2009 | Kubota et al. | |
| 2011/0079798 A1 | 4/2011 | Ogihara | |

FOREIGN PATENT DOCUMENTS

| | | |
|---|---|---|
| JP | 11-31828 | 2/1999 |
| JP | 2006-86388 | 3/2006 |
| JP | 2009-231816 | 10/2009 |
| JP | 2011-77447 | 4/2011 |

* cited by examiner

*Primary Examiner* — Thinh T Nguyen
(74) *Attorney, Agent, or Firm* — Antonelli, Terry, Stout & Kraus, LLP.

(57) ABSTRACT

A method of manufacturing a semiconductor light emitting element includes preparing a semiconductor stacked layer structure by stacking a first semiconductor layer and a second semiconductor layer in this order, forming a second electrode and an insulating layer in this order on the second semiconductor layer, exposing the first semiconductor layer by removing a part of the second semiconductor layer, forming a first electrode by forming a metal layer on the exposed first semiconductor layer and the insulating layer and flattening a surface of the metal layer, forming a first electrode-side bonding layer having a top layer made of Au on the first electrode, preparing a support substrate including a support substrate-side bonding layer having a top surface made of Au, and bonding the first electrode-side bonding layer and the support substrate-side bonding layer.

5 Claims, 17 Drawing Sheets

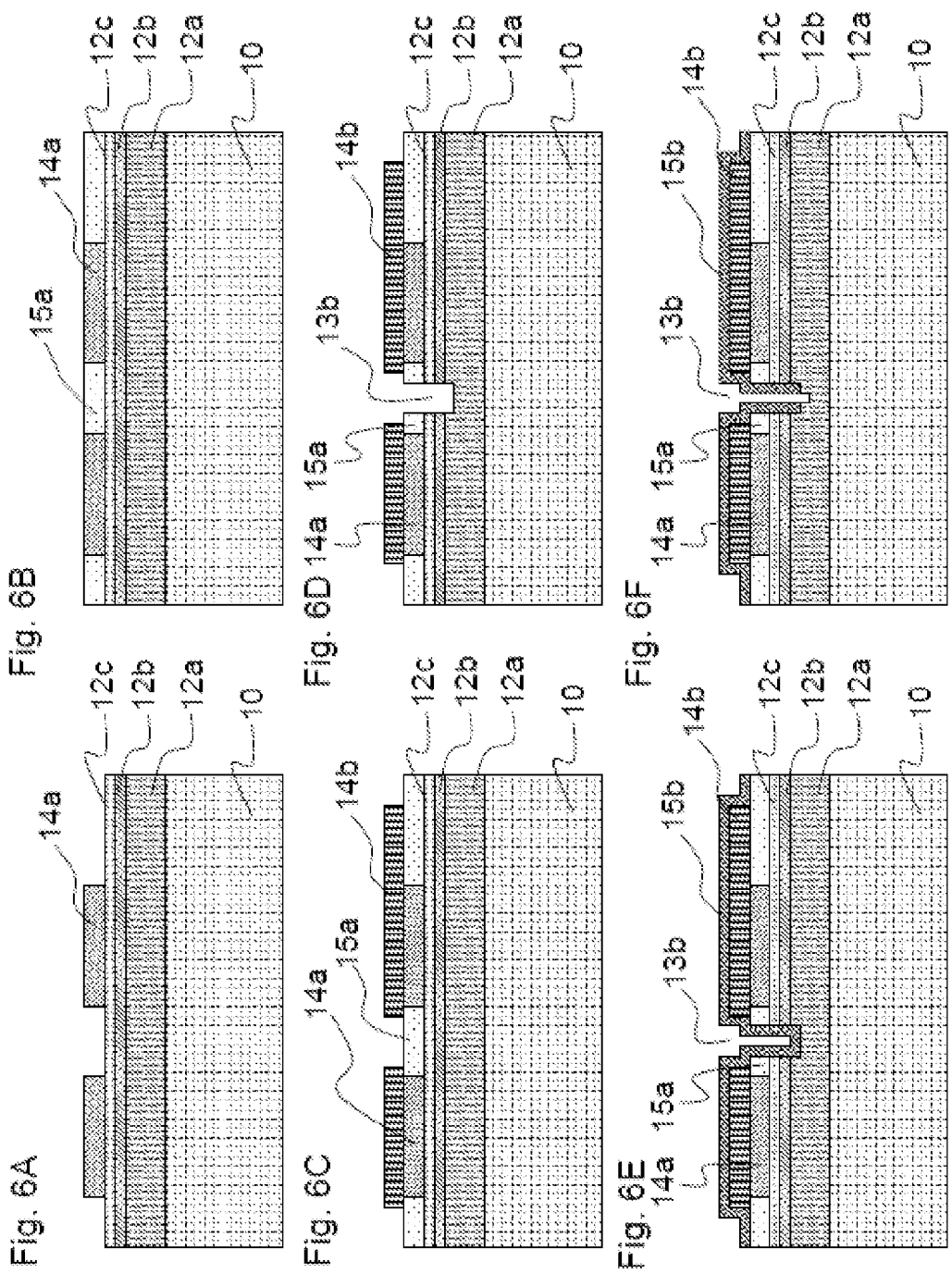

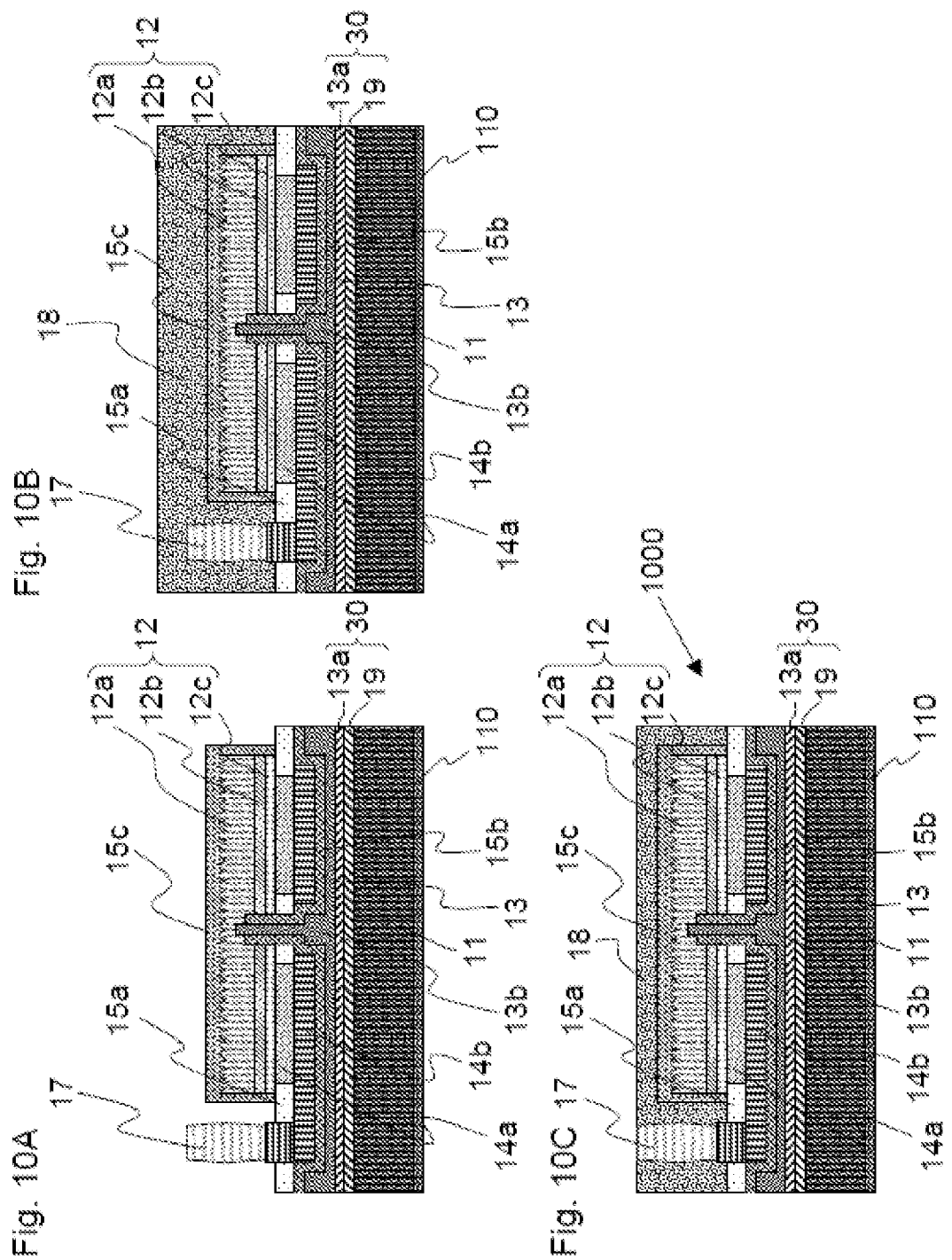

SEMICONDUCTOR LIGHT EMITTING ELEMENT AND METHOD FOR MANUFACTURING THE SAME

CROSS-REFERENCE TO RELATED APPLICATIONS

The present application claims priority under 35 U.S.C. §119 to Japanese Patent Application No. 2012-159152, filed Jul. 18, 2012, the contents of which are incorporated herein by reference in their entireties.

BACKGROUND OF THE INVENTION

The present disclosure relates to a semiconductor light emitting element and method for manufacturing the same.

In the field of semiconductor light emitting element (such as LED), technologies for transferring a semiconductor stacked layer structure which has a light emitting layer from a growth substrate-side of wafer (sapphire, GaN etc.,) to a support substrate-side wafer made of a foreign material (Si, Cu, Mo, W, Al, C or a compound including those) which has excellent heat releasing property or workability have been developed. Particularly noteworthy is a technology in which a growth substrate-side wafer and a support substrate-side wafer are bonded together, then the growth substrate is removed.

For bonding technology, eutectic bonding which employs an alloy material such as AuSn or SnPd is well known, in which the temperature of a bonded wafers is increased to its eutectic point to allow the alloy layer between the wafers to liquefy, which then forms an eutectic in a cooling process to bond the wafers with each other. Eutectic bonding has an advantage in which the alloy between the wafers is once liquefies during eutectic bonding, which allows easy bonding even in the case where the wafers have rather irregular surfaces. However, in the case where the alloy is AuSn, a high temperature of 300° C. or more is necessary in bonding, which may results in thermal damage to the electrodes disposed on the wafer and/or deterioration of electrical contact between the semiconductor stacked layer structure and the electrodes. In the case where SnPd which allows bonding of a low temperature is used, thermal damage may be avoided during the bonding. However, the eutectic portion can be re-liquefied at a low temperature, which may decrease the reliability of the bonding under circumstances where a heat is applied after manufacture of the LED.

Further, in the case where the bonded layer contains voids, the stress loaded on the semiconductor stacked layer structure over the voids is significantly differ from that over normal bonded portions, which may results in generation of damaged portions (cracks etc.) in the semiconductor stacked layer structure over the voids when the stress applied thereon changes at the time when the growth substrate is removed by using LLO (Laser Lift Off) process.

A known technology relates to wafer bonding, which is to remove the damaged portions generated during the LLO process is disclosed (for example, see Japanese Patent Publication No. 2006-86388A), in which, a semiconductor thin layer is disposed on a substrate, and then, the semiconductor thin layer is removed from the substrate by using laser abbreviation or the like, then the semiconductor thin layer is polished by way of CMP (Chemical Mechanical Polishing) to smooth the surface and to remove the damaged portions of the semiconductor thin layer.

However, if a large void is contained in the bonding layer, it may cause a generation of crack which reaches the light emitting layer, which may lead short circuit or the like, thus may results in degradation of reliability of the products. Such voids in the bonding layer may results in complete or partial detachment of the corresponding layers even after completion of the LED production, which would lead to degradation of the quality of the products.

Further, according to Japanese Patent Publication No. 2006-86388A, the semiconductor light emitting element has an n-side electrode made of an n-side contact metal layer and an n-side transparent electrode layer disposed on the gallium nitride layer which is detached from the substrate, so that the light extracting surface of the semiconductor light emitting element is shaded by the electrode.

SUMMARY OF THE INVENTION

A method of manufacturing a semiconductor light emitting element according to the present invention includes preparing a semiconductor stacked layer structure by stacking a first semiconductor layer and a second semiconductor layer in this order, forming a second electrode and an insulating layer in this order on the second semiconductor layer, exposing the first semiconductor layer by removing a part of the second semiconductor layer, forming a first electrode by forming a metal layer on the exposed first semiconductor layer and the insulating layer, and flattening a surface of the metal layer, on the first electrode, forming a first electrode-side bonding layer having a top layer made of Au, preparing a support substrate including a support substrate-side bonding layer having a top surface made of Au, and bonding the first electrode-side bonding layer and the support substrate-side bonding layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 6A to FIG. 6F are schematic diagrams illustrating a process of a method of manufacturing a semiconductor light emitting element according to a first embodiment.

FIG. 10A to FIG. 10C are schematic diagrams illustrating a variant example of a process of a method of manufacturing a semiconductor light emitting element according to a first embodiment.

DESCRIPTION OF THE EMBODIMENTS

Figure 1:
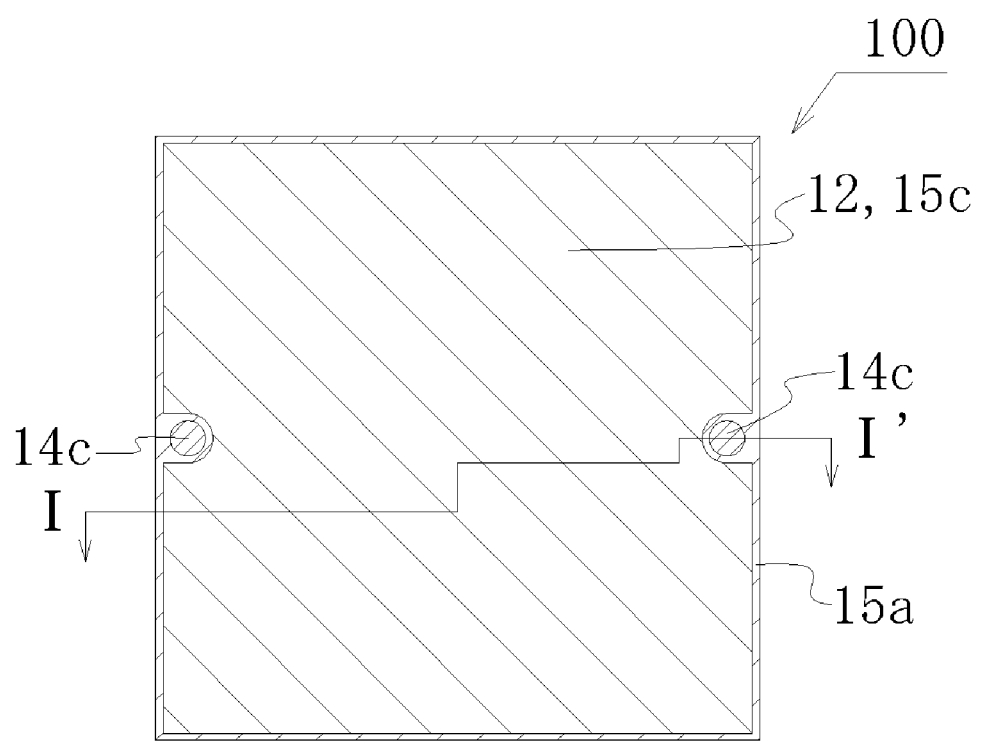
FIG. 1 is a schematic plan view showing a semiconductor light emitting element according to a first embodiment.

Hereinafter, embodiments of the present invention will be described in detail with reference to the drawings. The preferred embodiments are intended as illustrative of a light emitting element to give a concrete form to technical ideas of the present invention, and the scope of the invention is not limited to those described below. Particularly, the sizes, materials, shapes and the relative arrangement etc., of the members described in examples are given as an example and not as a limitation to the scope of the invention unless specifically stated. Further, in the description below, identical members or members of the same quality are assigned the same names and reference numerals and detailed description thereof will be appropriately omitted. In addition, a plurality of structural elements of the present invention may be configured as a single part which serves the purpose of a plurality of elements, on the other hand, a single structural element may be configured as a plurality of parts which serve the purpose of a single element. Further, constitutions described in some of examples and embodiments can be employed in other examples and embodiments.

A method of manufacturing a semiconductor light emitting element according to the present invention includes preparing a semiconductor stacked layer structure by stacking a first semiconductor layer and a second semiconductor layer in this order, forming a second electrode and an insulating layer in this order on the second semiconductor layer, exposing the first semiconductor layer by removing a part of the second semiconductor layer, forming a first electrode by forming a metal layer on the exposed first semiconductor layer and the insulating layer, and flattening a surface of the metal layer, on the first electrode, forming a first electrode-side bonding layer having a top layer made of Au, preparing a support substrate including a support substrate-side bonding layer having a top surface made of Au, and bonding the first electrode-side bonding layer and the support substrate-side bonding layer.

With the arrangement described above, the entire surface of the metal layer can be flattened, so that the first electrode having high flatness can be formed. The arrangement described above allows bonding of the flat Au portions together. Thus, generation of voids can be prevented, and with the Au—Au bonding, a semiconductor light emitting element of high reliability with excellent heat resistance and mechanical strength can be manufactured.

The first electrode is preferably made of an alloy containing Al.

With this arrangement, a semiconductor light emitting element having a first electrode with a high reflectance can be manufactured.

Further, the first electrode is preferably made of an AlCu alloy.

An AlCu alloy has a high Brinel hardness, so that mechanical performance becomes predominant in CMP treatment which facilitates flattening of the surface.

The first electrode is preferably formed so that the thickness from the exposed surface of the first semiconductor layer to the surface of the first electrode is 3 μm or greater and 10 μm or less.

Thus, formation of the first electrode by flattening the surface of the metal layer is preferably performed by way of chemical mechanical polishing treatment.

With this arrangement, the first electrode can be formed with high flatness.

A semiconductor light emitting element according to the present invention includes a support substrate, a bonding layer disposed on the support substrate, a first electrode disposed on the bonding layer, and a semiconductor stacked layer unit disposed on the first electrode. The bonding layer includes a plurality of gaps which has a height in a stacking direction of the semiconductor stacked layer unit being lower than a bottom surface of the first electrode.

Further, the bottom surface of the first electrode is preferably flat.

With this arrangement, occurrence of voids can be prevented and a semiconductor light emitting device of high reliability can be obtained.

Also, the size of the gaps in the stacking direction of the semiconductor stacked layer unit is preferably larger than zero and smaller than 100 nm. In the present specification, the term "a void" means a space of 100 nm or greater in the stacked direction of the semiconductor stacked layer unit 12 which is represented by a shape which is in conformity (or similar) to the shape of the bottom surface of the first electrode, or the height reaches the bottom surface of the first electrode.

With this arrangement, generation of cracks in the semiconductor stacked layer unit over the gaps can be prevented.

It is preferable that the bonding layer includes an Au layer and the Au layer includes the gaps.

Thus, a semiconductor light emitting element with heat resistance and high reliability can be obtained by the Au—Au bonding.

Accordingly, the present invention provides a semiconductor light emitting element in which generation of voids is prevented and has a high reliability, and a method of manufacturing the same.

First Embodiment

Figure 2:
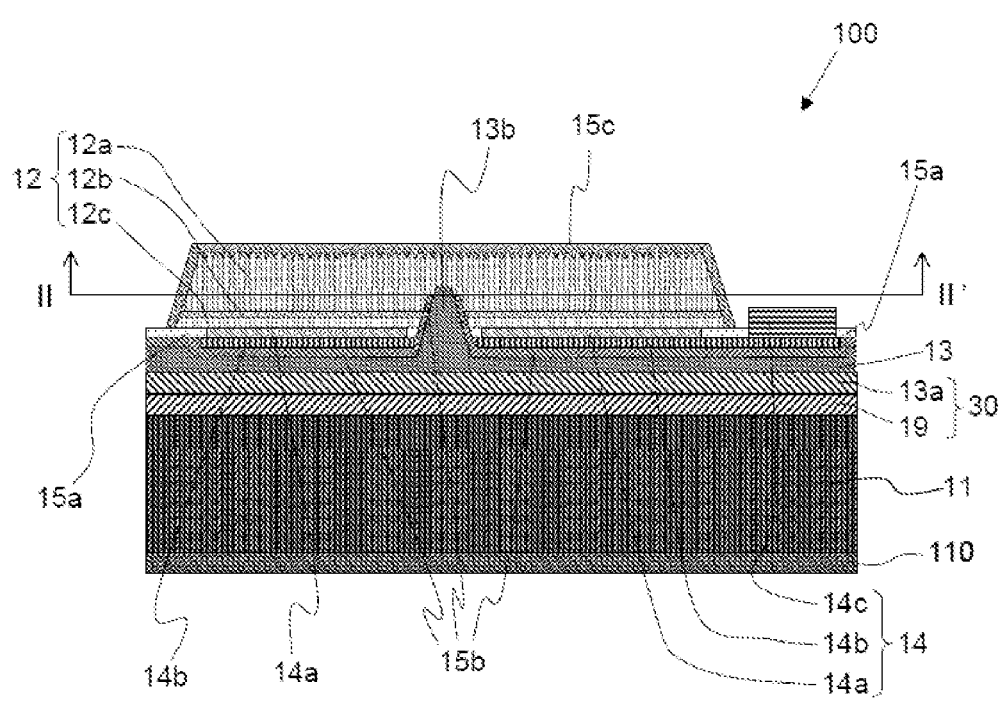
FIG. 2 is a schematic cross-sectional view showing a semiconductor light emitting element according to a first embodiment.
Figure 3:
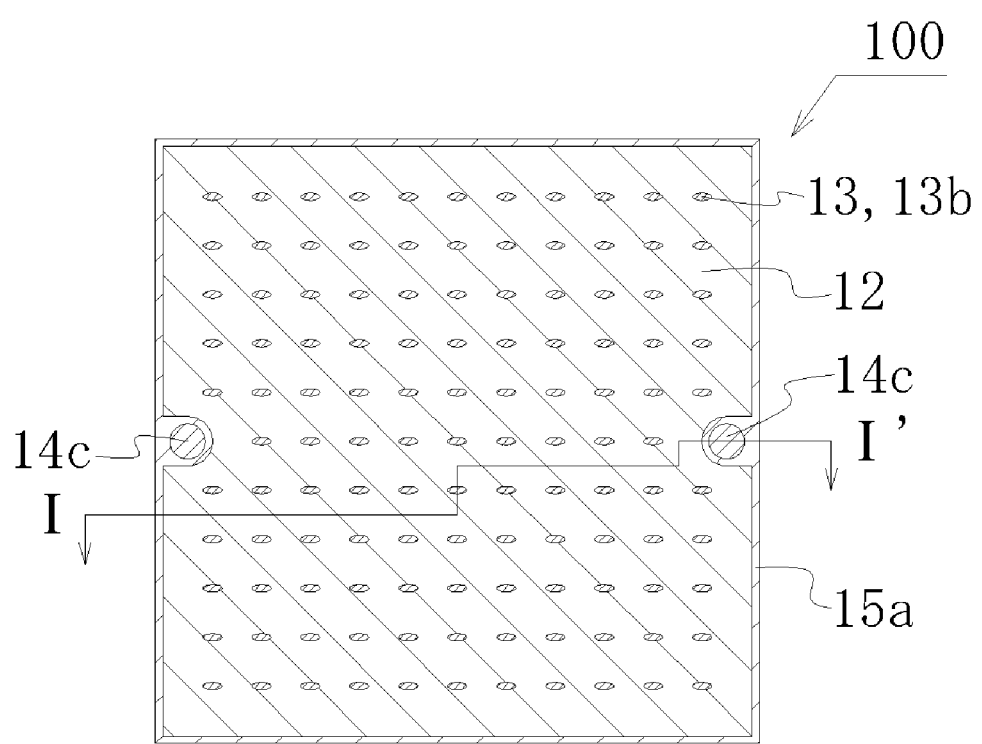
FIG. 3 is a schematic plan view showing a semiconductor light emitting element according to a first embodiment.
Figure 4:
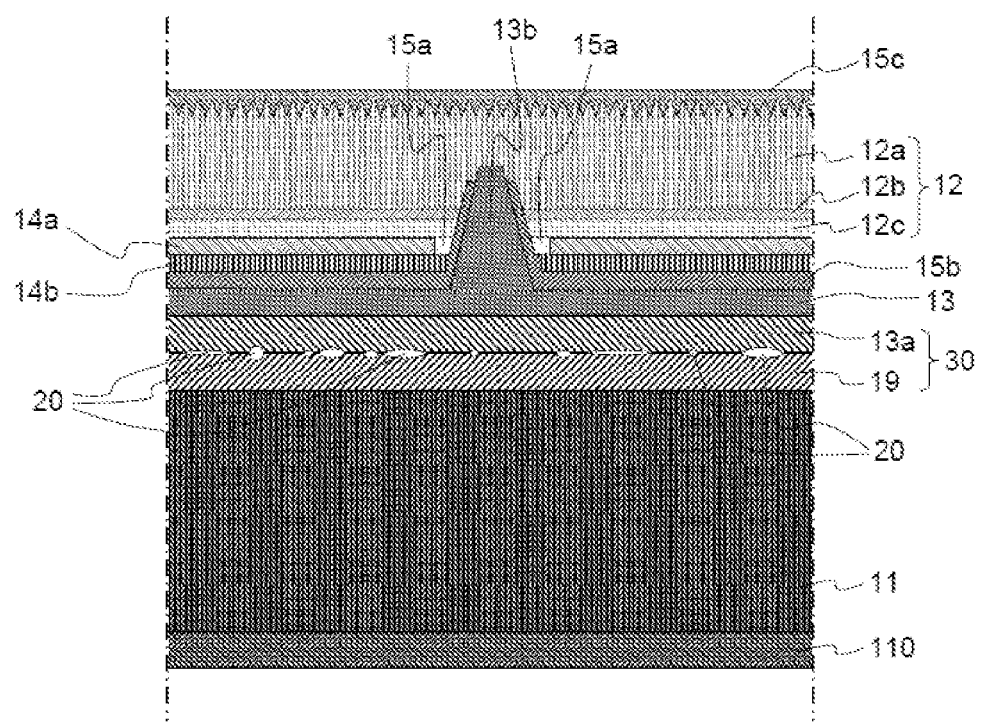
FIG. 4 is a partially enlarged view of FIG. 2, showing a schematic cross-sectional view of a semiconductor light emitting element according to a first embodiment.
Figure 5:
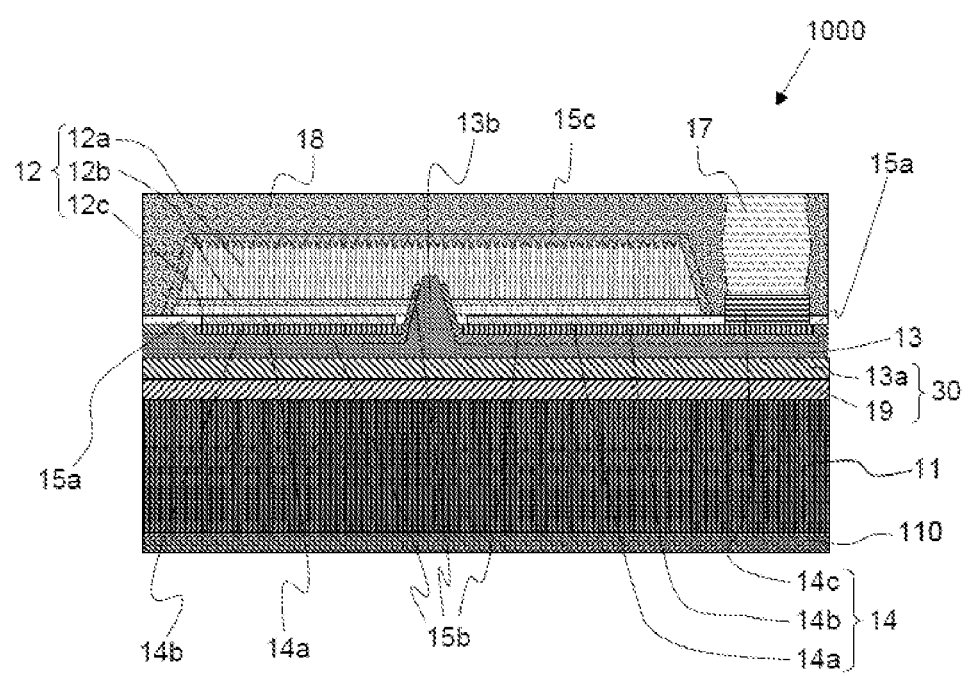
FIG. 5 is a schematic cross-sectional view showing a variant example of a semiconductor light emitting element according to a first embodiment.

A semiconductor light emitting element according to a first embodiment will be described in detail below with reference to accompanying drawings. FIG. 1 is a schematic plan view showing a semiconductor light emitting element according to a first embodiment. FIG. 2 is a cross sectional view schematically showing a schematic cross-sectional view of a semiconductor light emitting element according to the first embodiment taken along line I-I' of FIG. 1. FIG. 3 is a schematic plan view showing a semiconductor light emitting element according to the first embodiment taken along line II-II' of FIG. 2 (protective layer 15c is not shown). The lines I-I' shown in FIG. 1 and FIG. 3 indicate the same line. FIG. 4 is a partially enlarged view of FIG. 2, showing a schematic cross-sectional view of a semiconductor light emitting element according to a first embodiment. FIG. 5 is a schematic cross-sectional view showing a variant example of a semiconductor light emitting element according to a first embodiment. For the simplicity of explanation, FIG. 1 to FIG. 5 are shown in different scales.

In the present specification, the surface of the semiconductor light emitting element 100 at the semiconductor stacked layer unit 12 side is referred to an upper surface and used as the light extracting surface. In the present specification, the term "on" used in expression such as "on a layer" includes in its meaning not only "disposed in contact with an upper surface" but also "disposed in spaced apart relationship to an upper surface, and is used including the cases where there is an intervening member between the members. Further, the term "in plan view" refers to a view of a semiconductor light emitting element 100 seen from a side where the semiconductor stacked layer unit 12 is disposed, and also includes a transmissive plan view.

The light emitting element 100 according to the first embodiment may includes a support substrate 11, a bonding layer 30 disposed on the support substrate 11, a first electrode disposed on the bonding layer 30, and a semiconductor stacked layer unit 12 disposed on the first electrode 13. Further, the bonding layer 30 may include a first electrode-side bonding layer 13a and a support substrate-side bonding layer 19, and the semiconductor stacked layer unit 12 may include a first semiconductor layer 12a, a light emitting layer 12b, and a second semiconductor layer 12c.

The semiconductor light emitting element 100 according to the first embodiment may include a bonding layer 30 including a support substrate-side bonding layer 19 and a first electrode-side bonding layer 13a in this order on the support substrate 11 which has a rectangular shape and which includes a backside bonding layer 110 on the bottom surface, and the first electrode 13 is disposed on the first electrode-side bonding layer 13a. A second electrode 14 including a reflective electrode 14a, a wiring electrode 14b and a pad electrode 14c are disposed on the first electrode 13. Further, the semiconductor light emitting element 100 include a semiconductor stacked layer unit 12, in which a second semiconductor layer 12c, a light emitting layer 12b, and a first semiconductor layer 12a are stacked in this order on the first electrode 13 and the second electrode 14, having an approximately rectangular shape as that of the support substrate 11. The semiconductor stacked layer unit 12 includes a recessed portion at a center of each of two peripheral sides at opposite sides. Also, the second semiconductor layer 12c and the light emitting layer 12b are partially removed to expose the first semiconductor layer 12a. A plurality of regions each having an approximately ellipsoidal shape are created in a matrix at regular intervals on approximately the entire bottom surface of the semiconductor stacked layer unit 12 to expose the first semiconductor layer 12a. The side surfaces of the exposed portions of the first semiconductor layer 12a are not made up of single planes but are tapered in two steps.

The first electrode 13 is disposed on the first electrode-side bonding layer 13a and approximately the entire surface of the semiconductor light emitting element 100 in plan view. Thus, the first electrode 13 is disposed with a larger area than that of the semiconductor stacked layer unit 12, so that the first electrode 13 has portions exposed from the semiconductor stacked layer unit 12. The bottom surface of the first electrode 13, that is, the surface which is in contact with the bonding layer 30 is flat. In plan view, the first electrode 13 and the second electrode 14 are overlapped in part. For example, the first electrode 13 and the second electrode 14 are overlapped under the second semiconductor layer 12c and are not overlapped under the regions (through-holes 13b) where the first semiconductor layer 12a is exposed. The first electrode 13 is connected to the exposed portions of the first semiconductor layer 12a through the through-holes 13b which penetrate the wiring electrode 14b of the second electrode 14, the reflective electrode 14a, the second semiconductor 12c, the light emitting layer 12b, and a part of the first semiconductor layer 12a of the semiconductor stacked layer unit 12. The through-holes 13b are tapered from the second semiconductor layer 12c toward the first semiconductor layer 12a.

The bonding layer 30 contains a plurality of gaps 20. The gaps 20 have a height lower than the bottom surface of the first electrode 13 in the stacked direction of the semiconductor stacked layer unit 12; that is, the gaps 20 do not extend up to the bottom surface of the first electrode 13 in the stacked direction of the semiconductor stacked layer unit 12. The gaps 20 are arrayed approximately in parallel to the bottom surface of the first electrode 13. The gaps 20 are contained in the interface between the support substrate-side bonding layer 19 and the first electrode-side bonding layer 13a, with irregular shape and size, and with irregular intervals. The gaps 20 are not concentrated in certain portions and are distributed in the entire plane of the bonding layer 30 along the interface.

In the second electrode 14, the reflective electrode 14a is disposed to cover approximately the entire upper surface of the second semiconductor layer 12c. The wiring electrode 14b is disposed on the surface of the reflective electrode 14a which is the opposite side to the surface which is in contact with the second semiconductor layer 12c to cover the reflective electrode 14a. The wiring electrode 14b is extended to be exposed from the semiconductor stacked layer unit 12 in a planar view, that is, the wiring electrode 14b is extended to a region so as not to overlap with the semiconductor stacked layer unit 12. A pad electrode 14c is formed on the portion of the wiring electrode 14b which is exposed from the semiconductor stacked layer unit 12. As described above, the pad electrode 14c is located lateral to the semiconductor stacked layer unit 12, in a planar view, in a region different from the semiconductor stacked layer unit 12. Two pad electrodes 14c are disposed on a rectangular semiconductor light emitting element 100 each at about the center of a side at opposite peripheral portions of the semiconductor light emitting element 100. In other words, the pad electrodes 14c are arranged in regions other than the corner portions of the semiconductor light emitting element 100.

The insulating layer 15b is disposed between the first electrode 13 and the second electrode 14. The insulating layer 15b is extended from below the second electrode 14 to cover a side surface of the second electrode 14 which defines the through-hole 13b, and a respective side surface of the second semiconductor layer 12c and the light emitting layer 12b, and a part of a side surface of the first semiconductor layer 12a. With this arrangement, a three-dimensional electrode structure is provided, in which, the first electrode and the second electrode which are overlapped in a planar view are insulated from each other. The protective layer 15a is disposed on portions of the surface of the second semiconductor layer 12c which are not covered with the second electrode 14. Further, portions of the semiconductor layer 12 other than the forming surfaces of the first electrode 13 and the second electrode 14, that is, the side surface and the upper surface of the semiconductor stacked layer unit 12 are covered with the protective layer 15c.

As a variant example of the first embodiment, a bump 17 and a wavelength converting member 18 may be provided to the semiconductor light emitting element 100 to obtain a semiconductor element 1000. In detail, a bump 17 is disposed on each of the two pad electrodes 14c, and a wavelength converting member 18 is disposed to cover the side surfaces of the bumps 17, the protective layer 15c, and the pad electrodes 14c. The upper surface of the wavelength converting member 18 is approximately the same height as the bumps 17 and the upper surface of each bump 17 is exposed. The wavelength converting member 18 has an upper surface and side surfaces approximately perpendicular to the upper surface, so that the semiconductor light emitting element 1000 has an overall external appearance of an approximately cubic shape or an approximately rectangular parallelepiped shape.

Each component of the present embodiment will be described in detail below.

(Support Substrate 11)

Examples of the support substrate include, other than a Si substrate, a semiconductor substrate made of GaAs, a conductive substrate made of a metal member such as Cu, Ge, and Ni or made of a composite material of Cu—W. In addition, a composite of metal and ceramics such as Cu—Mo, AlSiC, AlSi, AlN, SiC, Cu-diamond, and the like can also be used. For example, Cu—W, and Cu—Mo can be represented by the general formulas $Cu_XW_{100-X}$ ($0 \leq X \leq 30$), $Cu_XMo_{100-X}$ ($0 \leq X \leq 50$) respectively. The advantage of using Si is its low price and easiness in chip formation. The support substrate preferably has a thickness of 50 to 500 µm. Heat dissipation can be improved by arranging the film thickness of the support substrate in this range. On the other hand, if a conductive substrate is used as the support substrate, electric power can be supplied from the substrate side and an element having high electrostatic withstand voltage and excellent heat dissipation properties can be obtained. Typically using an opaque material such as Si, Cu (Cu—W), a reflecting structure is preferably provided between the support substrate and the semiconductor layer or within the semiconductor layer to obtain improved heat dissipation and light emitting properties. A plating member may be applied on the nitride semiconductor layer by way of plating to form a support substrate or a bonding portion with the support substrate. It is not necessary to provide an element with a support substrate, and an element can be directly mounted on a mounting portion or on a base of a light emitting device, or a structure can be employed in which a metal member disposed by way of plating or the like is provided on the semiconductor layer.

(Semiconductor Stacked Layer Unit 12)

The first semiconductor layer, the light emitting layer, and the second semiconductor layer which are constitutive layers of the semiconductor stacked layer unit are not specifically limited and may be any one of an InAlGaP system, an InP system, an AlGaAs system, a mixed crystal of those, and a nitride semiconductor such as of a GaN system. Examples of such a nitride semiconductor include GaN, AlN, InN, and a Group III-V nitride semiconductor ($In_XAl_YGa_{1-X-Y}N$ ($0 \leq X$, $0 \leq Y$, $X+Y \leq 1$)) which is a mixed crystal of those. Further, in the mixed crystal, B may be used for a part or all of the Group III element and a part of N may be substituted by P, As, or Sb for the Group V element. Those semiconductor layers are generally doped with either an n-type or a p-type impurity. In the first and second semiconductor layers in the specification, the term "first semiconductor layer" refers to an n-type or p-type semiconductor layer, and the term "second semiconductor layer" refers to a layer having a conductivity of a type that is different from the first semiconductor layer, that is to a p-type or an n-type semiconductor layer. Preferably, the first semiconductor layer is an n-type semiconductor layer and the second semiconductor layer is a p-type semiconductor layer.

The semiconductor layer may have a single layer structure, a homo structure having an MIS junction, a PIN junction, or a PN junction, or a stacked layer structure having a hetero structure or a double hetero structure. That is, the element may have a light emitting portion in which the n-type semiconductor layer and the p-type semiconductor layer are directly in contact with each other, or the element may have a light emitting portion which is an active layer disposed between the n-type semiconductor layer and the p-type semiconductor layer. The thickness of each layer is not specifically limited, and can be appropriately adjusted.

The semiconductor stacked layer unit 12 may have any shape in a planar view. In the present embodiment, the semiconductor stacked layer has an approximately rectangular shape in a planar view, but an appropriate shape such as a circular shape, an oval shape, a polygonal shape, or the like, can be employed.

The semiconductor stacked layer unit 12 has a slope on the side surfaces so that the outline of the first semiconductor layer 12a is smaller than the outline of the second semiconductor layer 12c in a planar view. That is, in the present embodiment, the semiconductor stacked layer unit 12 has forward tapered side surfaces. Accordingly, total internal reflection of light at the side surfaces of the semiconductor stacked layer unit 12 can be prevented and the light extraction can be improved. The semiconductor stacked layer unit 12 may have inverse-tapered side surfaces so that the first semiconductor layer 12a has a larger area than the second semiconductor layer 12c. With this arrangement, in the semiconductor stacked layer unit 12, light can be reflected upward at the side surfaces to be extracted.

The upper surface of the first semiconductor layer 12a has a rough surface or an irregular surface. With this arrangement, light extracting efficiency can be improved. The rough surface or the irregular surface may be provided on the entire upper surface or at least a part of the upper surface of the first semiconductor layer 12a.

(First Electrode 13)

The first electrode can be formed with a metal, a single layer or stacked layer of metal or alloy containing at least one selected from the group consisting of nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), indium (In), tin (Sn), carbon (C), cobalt (Co), iron (Fe), manganese (Mn), molybdenum (Mo), chromium (Cr), tungsten (W), lanthanum (La), copper (Cu), silver (Ag), yttrium (Y), aluminum (Al), magnesium (Mg), zinc (Zn), silicon (Si), gold (Au), an oxide, a nitride or a boride of these metals, and a transparent conductive oxide such as ITO, ZnO, and $In_2O_3$.

In order to establish electrical continuity with the first semiconductor layer 12a, the first electrode 13 is extended from below the second electrode 14 toward upper surface to reach the through-hole 13b, then, the first electrode 13 is disposed to fill the through-hole 13b and is in contact to the first semiconductor layer 12a. In the through-hole 13b, the first electrode 13 may have a thickness of 3 µm or greater or 10 µm or less from the exposed surface of the first semiconductor layer 12a to the bottom surface of the first electrode 13. Further, regions other than the through-hole 13b, in other words, a region of the first electrode 13 under the wiring electrode 14b preferably has a thickness of 1 µm or greater. The side surface of the first electrode 13 in the through-hole 13b has a portion exposed from the insulating layer 15b and is in contact with the first semiconductor layer 12a at the upper surface and a part of the side surface of the first electrode 13. In other words, the first semiconductor layer 12a is in contact with the first electrode 13 and the insulating layer 15b in a form of two steps. With this arrangement, the contact area between the first electrode 13 and the first semiconductor layer 12a can be greater than covering the entire side surfaces of the first electrode 13 with the insulating layer 15b, which facilitates spreading of the electric current and thus Vf (forward voltage) can be reduced. The thickness of the first electrode 13 is not specifically limited, but the bottom surface of the first electrode 13 located directly under the first semiconductor layer 12a which is exposed in the through-hole 13b is preferably at a lower side than the bottom surface of the insulating layer 15b which covers the bottom surface (in detail, the bottom surface of the wiring electrode 14b) of the second electrode 14. The thickness can be appropriately adjusted in view of the properties to obtain.

The first electrode 13 is formed by flattening a metal layer disposed on the inside of the through-hole 13b and the surface of the insulating layer 15b as in a manufacturing method to be described later. The metal layer may either be a single-layer or a multi-layer, but in the case where a flattering of a layer to be performed, the layer is preferably made of Al, Au, Cu, W, Ti, Mo, Nb, Ta, V, In, Sn, Pd, Si, or C or an alloy, a nitride, a boride, or an oxide which contains those.

Also, in the case where the metal layer is a single layer, in addition to in view of ohmic contact with the first semiconductor layer 12a, a material which reflects light from the light emitting layer 12b as in the second electrode 14 is preferably used. More specifically, an Al alloy, preferably an AlCu alloy can be employed. Particularly, an Al alloy containing Cu or Si can prevent corrosion and oxidation. Also, the Brinell hardness of such an alloy is greater than that of pure Al, which facilitates flattening by way of CMP, and thus preferable. In the case where an Al alloy contains Cu, the reflectance decreases with an increase of Cu content. For this reason, the content of Cu is preferably 1% or greater and 10% or less.

In the present embodiment, in a planar view, a plurality of through-holes 13b each having an oval shape are arranged in matrix with equal intervals. With this arrangement, a necessity of provision of a pad electrode to each first electrode 13 can be eliminated, and a plurality of through-holes 13b are arranged spaced apart from each other in a small area. Thus, a large area can be secured for the light emitting area and the current density can be uniformed which reduces the Vf (forward voltage), and thus uniform emission can be realized. The shapes of the through-holes 13b in a planar view is not limited to an elliptical shape and an appropriate shape such as a circular shape, a polygonal shape, a linear shape, a curved-line shape can be employed. Also, the shapes of the through-holes in a planar view may vary or may have a shape in which a plurality of shapes are connected. The smaller the area of the shape the greater the Vf. Therefore, an oval shape having an area slightly larger than its corresponding circular shape or a linear shape may be employed. The number and positions of the through-holes can be appropriately changed according to the size and shape of the semiconductor stacked layer unit 12. As described above, not only a matrix arrangement, but a line-symmetric arrangement, a point symmetric arrangement, an arrangement with uneven intervals may also be employed.

(First Electrode-Side Bonding Layer 13a)

The first electrode-side bonding layer 13a is disposed on approximately the entire surface of the lower surface of the first electrode 13, and is bonded to the support substrate-side bonding layer 19. The first electrode-side bonding layer 13a can serve as a binder and also as electric current supplier as the first electrode 13. If the first electrode 13 is formed with a flat surface, there is no necessity of flattening the surface of the first electrode-side bonding layer 13a, but a flattening treatment may also be applied on the top surface of the first electrode-side bonding layer 13a. The first electrode-side bonding layer 13a and the support substrate-side bonding layer 19 are bonded to form a bonding layer 30. The first electrode-side bonding layer 13a can be made of a material which can be used for the first electrode 13, and a single layer, a stacked layer, or an alloy of those materials can be used. Employing an Au—Au bond which has a high resistivity against heat in the bonding surface between the first electrode-side bonding layer 13a and the support substrate-side bonding layer 19 allows obtaining of a semiconductor light emitting element with high reliability. This can be achieved by forming the first electrode-side bonding layer 13a having a top surface made of Au on the bottom surface of the first electrode 13.

(Support Substrate-Side Bonding Layer 19)

The support substrate-side bonding layer 19 is formed on approximately the entire upper surface of the support substrate 11, for bonding to the ohmic electrode of the support substrate 11 and to the first electrode-side bonding layer 13a. The support substrate-side bonding layer 19 can employ a material similar to that used for the first electrode-side bonding layer 13a. In the case where the support substrate-side bonding layer 19 is made of a metal stacked layer, the top layer is preferably made of Au for bonding to the first electrode-side bonding layer with an Au—Au bond.

In the first embodiment, the bonding layer 30 is preferably made of a solid-phase diffusion bonding such as an Au—Au bonding or a Cu—Cu bonding at the bonding surface between the first electrode-side bonding layer 13a and the support substrate-side bonding layer 19. Solid-phase diffusion bonding is achieved by atomic diffusion of single element. Thus, when the bonding is completed, the bonding interface disappears to form a single solid phase, which provides a very stable bonding layer. For a complete solid-phase diffusion bonding, it is necessary to remove the impurities which are weakly bonded to unattached bonds on the wafer surface to be bonded, and then bond the wafers while the unattached bonds are kept free. However, a sufficient bonding can be achieved even with the unbonded bonds are not completely free, by accelerating the diffusion speed of atoms with addition of a low heat (about 150° C.). In solid-phase diffusion bonding, atomic diffusion takes place between completely contacting surfaces, so that irregularity and unevenness on the surfaces of the wafers are needed to be minimized. For this reason, the flat first electrode-side bonding layer 13a is disposed on the flat bottom surface of the first electrode 13 and bonded to the flat top surface of the support substrate-side bonding layer 19. Thus, a strong bonding layer 30 can be obtained.

(Gap 20)

The gaps 20 exist in the bonding layer 30 and have a height lower than the bottom surface of the first electrode 13 in the stacked direction of the semiconductor stacked layer unit 12. The gaps 20 are arrayed approximately in parallel to the bottom surface of the first electrode 13. The gaps 20 are preferably exist in the bonding interface between the first electrode-side bonding layer 13a and the support substrate-side bonding layer 19. In the present embodiment, the expression that "gaps 20 are arrayed approximately in parallel to the bottom surface of the first electrode 13" does not indicate the contour of the gaps are arranged along the bottom surface of the first electrode, but indicates that when the plurality of gaps 20 are viewed in a cross section of the semiconductor light emitting element, the plurality of gaps 20 are arranged in a linear manner. The above also includes a case where the bottom surface of the first electrode 13 has an irregular surface and the plurality of gaps are arranged in a linear manner along the irregular surface. The shape and size of the gaps 20 may differ and the interval between the gaps 20 may also differ. The shape of the gaps 20 may vary such as a spherical shape, a plate shape, and an irregular shape, but the size of the gaps in the stacking direction of the semiconductor stacked layer unit 12 is preferably greater than 0 nm and smaller than 100 nm, and more preferably smaller than 80 nm. Also it is preferable that the bonding layer 30 includes an Au layer made of Au—Au bonding and gaps are included in the Au layer.

(Second Electrode 14)

The second electrode 14 may include a reflective electrode 14a, a wiring electrode 14b, and a pad electrode 14c and a material similar to that of the first electrode 13 can be used.

(Reflective Electrode 14a)

The reflective electrode 14a is for efficiently reflecting the light from the light emitting layer 12b, so that the reflective electrode 14a is preferably disposed with a wide area under approximately the entire surface of the second semiconductor layer 12c. In the present embodiment, the term "approximately the entire surface" indicates the regions except for the peripheral region of the second semiconductor layer 12c and the peripheral region of the exposed portion of the first semiconductor layer 12a, which is, for example, 70% or greater, moreover, 80% or greater with respect to the upper area of the semiconductor light emitting element 100. This arrangement allows maximizing the contact area of the reflective electrode 14a with the second semiconductor layer 12c, and thus reducing the contact resistance to reduce the driving voltage. Also, the light from the light emitting layer 12b becomes possible to be reflected at approximately the entire area of the second semiconductor layer 12c and thus the light extracting efficiency can be improved. The reflective electrode 14a may have a shape having a plurality of holes for forming the through-holes 13b through which the first electrode 13 establishes electrical continuity with the first semiconductor layer 12a. The reflective electrode is 14a preferably made of a single layer or a stacked layer of at least one metal selected from Al, Rh, and Ag, or an alloy of those, as a material to reflect the light from the light emitting layer, and among those, a metal layer containing Ag or an Ag alloy is preferable. In order to prevent migration, the side surfaces and the lower surface (the support substrate side) of the reflective electrode 14a may be completely covered with another layer containing a metal to be a cover electrode or a insulating protective layer. In the present embodiment, a wiring electrode 14b is disposed under the reflective electrode 14a and the side surfaces of the reflective electrode 14a are covered with a protective layer 15a, and thus, those also serve as a cover electrode.

(Wiring Electrode 14b)

A wiring electrode 14b is disposed under the reflective electrode 14a. The wiring electrode 14b covers approximately the entire surface of the reflective electrode 14a and is extended to connect the reflective electrode 14a with an external power source and has a region which is exposed from the semiconductor stacked layer unit 12 in a planar view. It is preferable that the wiring electrode 14b also reflects light from the light emitting layer 12b, and made of a material having a high electrical conductivity.

(Pad Electrode 14c)

In a planar view, a pad electrode 14c is formed on the portion of the wiring electrode 14b which is exposed from the semiconductor stacked layer unit 12. The pad electrode 14c may have a bump 17 disposed on the upper surface to connect to an external power source or a wiring. In the present embodiment, two pad electrodes 14c are disposed on the peripheral regions which are other than the corners of the semiconductor light emitting element 100, so as to interpose the semiconductor stacked layer unit 12, with identical circular shapes. The pad electrodes 14c are preferably disposed on the regions which are other than the corners. Considering that the wires for connecting to outside may block the emission, the pad electrodes 14c are preferably disposed at peripheral portions of the semiconductor light emitting element 100, but may be disposed at a center region of the semiconductor light emitting element 100. The size, number, and arrangement of the pad electrodes 14c can be appropriately adjusted according to the size of the semiconductor light emitting element 100 and the shape of the semiconductor stacked layer unit 12.

(Protective Layer 15a, 15c, Insulating Layer 15b)

Examples of the insulating layer 15b and the protective layer 15a, 15c include an oxide layer, a nitride layer, and an oxinitride layer, each containing at least one element selected from the group consisting of Si, Ti, V, Zr, Nb, Hf, and Ta. More specific examples include $SiO_2$, SiON, $ZrO_2$, SiN, BN, SiC, SiOC, AlN, and AlGaN. The insulating layer 15b and the protective layer 15a, 15c may be a single layer or a stacked layer made of a single material, or a stacked layer made of different materials. Also, a DBR layer may be employed.

(Backside Bonding Layer 110)

The backside bonding layer 110 is formed on the opposite side with respect to the surface on which the support substrate-side bonding layer 19 of the support substrate 11 is formed and serves as an ohmic electrode, and also is used for mounting the semiconductor light emitting element 100 on the mounting substrate. The backside bonding layer 110 may be a layer including a metal such as $TiSi_2$, Ti, Pt, Ru, Au, and/or Sn or a stacked layer of those. The backside bonding layer 110 may be made of a similar material of the first electrode-side bonding layer 13a and the support substrate-side bonding layer 19, but a resin may be employed.

(Wavelength Converting Member 18)

The wavelength converting member 18 may be made of a resin containing a light converting material to convert a part of light from the light emitting layer 12b to light having different wavelength. The light converting material is at least excited by the emission wavelength of light from the light emitting layer 12b and emits fluorescent light. For the light converting material, a known fluorescent material can be used, and for example, a YAG-based fluorescent material can be used. For the resin, according to the aim and application, a silicone-based resin such as a phenyl-based silicone resin, a dimethyl-based silicon resin, or a rigid hybrid silicone resin, or an epoxy-based resin can be used. In addition to a fluorescent material, a filler, a diffusing agent, or the like can be included in the resin. With this arrangement, light from the light emitting layer 12b can be converted, and for example, a semiconductor light emitting element 1000 to emit light of a desired color such as a white light and an incandescent light color can be obtained.

The upper surface of the wavelength converting member 18 is approximately the same height as the height of the upper surface of the bump 17. With this arrangement, the upper surface of the bump 17 is exposed from the wavelength converting member 18, so that the bump 17 at any position on the semiconductor light emitting element 100 in plan view can be connected to a wire. Thus, the forming position for the bump can be set freely at an appropriate location. The wavelength converting member 18 may have a rough surface, and with this, total reflection of light can be reduced at the time of extracting light from the wavelength converting member 18 to outside, thus extraction of light can be facilitated and the light extracting efficiency can be improved. The wavelength converting member 18 may have a plate-shape. For example, on the semiconductor stacked layer unit 12, a plate-shape wavelength converting member 18 may be disposed with an area greater than the area of the semiconductor stacked layer unit 12 in plane view, by using a resin for bonding.

Next, a method of manufacturing the semiconductor light emitting element 100 according to the first embodiment will be described in detail with reference to the drawings. FIG. 6A to FIG. 9R are schematic diagrams illustrating a step of a method of manufacturing a semiconductor light emitting element 100 according to a first embodiment. The steps of manufacturing are performed in the order as shown in FIG. 6A to FIG. 6F, FIG. 7G to FIG. 7J, FIG. 8K to FIG. 8N, and FIG. 9O to FIG. 9R. FIG. 10A to FIG. 10C are schematic diagrams illustrating a variant example (semiconductor light emitting element 1000) of a process of a method of manufacturing a semiconductor light emitting element according to the first embodiment. In the manufacturing, steps shown in FIG. 10A to FIG. 10C are performed subsequent to the steps shown in FIG. 6A to FIG. 9R. It should be noted that FIG. 6A to FIG. 6F, FIG. 7G to FIG. 7J, FIG. 8K to FIG. 8N, FIG. 9O to FIG. 9R and FIG. 10A to FIG. 10C are only schematic diagrams illustrating processes of a method of manufacturing a semiconductor light emitting element according to the first embodiment and a variant thereof. As such, certain details of the semiconductor light emitting element may be shown in these figures as simplified or may be omitted to facilitate understanding of the method. FIGS. 1-5 should be viewed for further details of the semiconductor light emitting element.

<Formation of Semiconductor Stacked Layer Structure 12>

First, as shown in FIG. 6A, a wafer of growth substrate 10 is prepared. The growth substrate 10 is made of a material suitable for epitaxially growing a semiconductor stacked layer structure and the size and the thickness of the substrate are not specifically limited. Examples of substrates suitable for epitaxially growing a nitride semiconductor include an insulating substrate such as sapphire and spinel, a transparent substrate, an electrically conductive substrate such as SiC, a nitride semiconductor (for example, GaN), and CuW. The growth substrate 10 may have irregularities on its surface. The growth substrate 10 (such as a sapphire substrate) having such an irregularity is placed in a MOCVD reactor and a semiconductor stacked layer structure 12 is formed by growing a first semiconductor layer 12a, a light emitting layer 12b and a second semiconductor layer 12c in this order on the sapphire substrate 10 having the irregularity.

<Formation of Reflective Electrode 14a>

On the surface of the second semiconductor layer 12c, as further shown in FIG. 6A, a reflective electrode 14a having holes which are made in conformity to the through-holes 13b is disposed in a pattern. In order to increase the area to supply electricity, the reflective electrode 14a is formed on the approximately entire surface of the second semiconductor layer 12c. The reflective electrode 14a may have a multilayer structure stacked via a thin adhesion layer capable of transmitting light, for example, an adhesion layer and/or a reflecting layer in this order.

<Formation of Protective Layer 15a>

As shown in FIG. 6B, a protective layer 15a is disposed on the second semiconductor layer 12c which is exposed from the reflective electrode 14a. The protective layer 15a may be disposed to cover a part of the reflective electrode 14a. With this arrangement, electric continuity can be obtained from the reflective electrode 14a which is selectively disposed on the surface of the second semiconductor layer 12c to the second semiconductor layer 12c.

<Formation of Wiring Electrode 14b>

On approximately the entire surfaces of the reflective electrode 14a and the protective layer 15a, the wiring electrode 14b is formed so that the holes of the reflective electrode 14a are also in conformity to the through-holes 13b as in the reflective electrode 14a, as shown in FIG. 6C.

<Formation of Through-Holes 13b (Etching of Semiconductor Stacked Layer Structure 12) (1)>

Except for the regions for the through-holes 13b, a resist is disposed on the upper surfaces of the protective layer 15a and the wiring electrode 14b and etching is performed, as shown in FIG. 6D. The through-holes 13b may be obtained by removing the protective layer 15a, the second semiconductor layer 12c, the light emitting layer 12b, and a part of the first semiconductor layer 12a through the opening of the resist by etching through the openings of the resist to expose the first semiconductor layer 12a. At this time, etching may be carried out in the first semiconductor layer 12a to expose the interface with the light emitting layer 12b, or into the first semiconductor layer 12a.

<Formation of Insulating Layer 15b>

The insulating layer 15b is formed to cover all portions of the wiring electrode 14b, the protective layer 15a, the reflective electrode 14a, the second semiconductor layer 12c, the light emitting layer 12b, and the first semiconductor layer 12a which define the through-holes 13b, as shown in FIG. 6E. With the insulating layer 15b, the first electrode 13 is insulated from the second electrode 14, the second semiconductor layer 12c, and the light emitting layer 12b.

<Formation of Through-Holes 13b (Etching of Semiconductor Stacked Layer Structure 12) (2)>

In the regions for the through-holes 13b, the insulating layer 15b is removed by etching to expose the first semiconductor layer 12a, as shown in FIG. 6F. A part of the first semiconductor layer 12a may be removed to remove the portions damaged at the time of etching the insulating layer 15b.

<Formation of First Electrode 13>

Figure 7G:
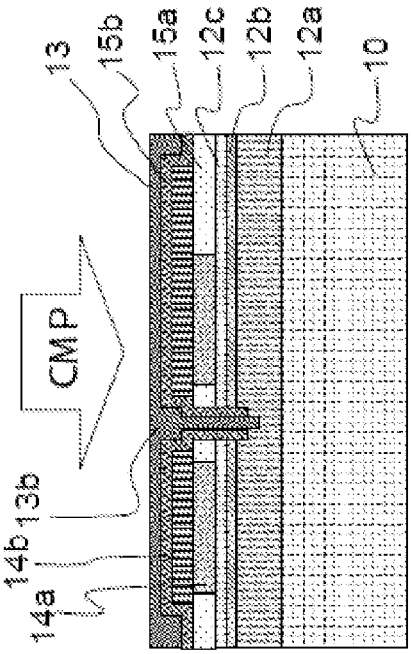
FIG. 7G to FIG. 7J are schematic diagrams illustrating a process of a method of manufacturing a semiconductor light emitting element according to a first embodiment.
Figure 7H:
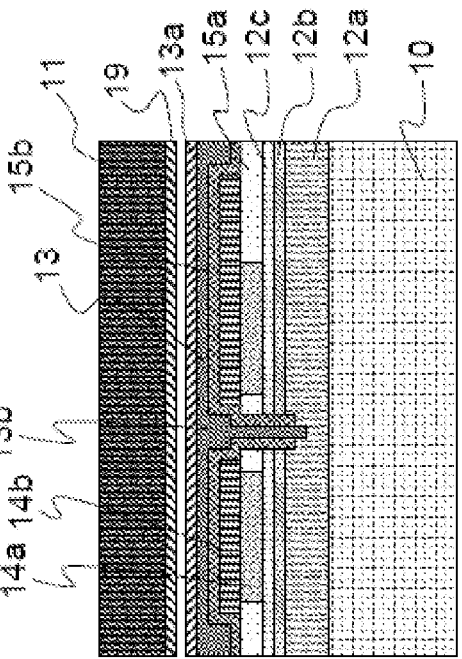

A metal layer is formed on the insulating layer 15b, as shown in FIG. 7G. The metal layer may either be a single-layer or a multi-layer as long as the metal layer fills the through-holes 13b and is in contact with the exposed surfaces of the first semiconductor layer 12a. The metal layer is formed so that the surface of the metal layer at directly above the first semiconductor layer 12a exposed in the through-holes 13b is higher than the second electrode 14, in detail, higher than the insulating layer 15b covering the wiring electrode 14b. That is, the metal layer connected to the exposed portions of the first semiconductor layer 12a is formed in the through-holes 13b and the surface of the insulating layer 15b with a thickness greater than the greatest height of the surface of the insulating layer 15b. It is preferable that the metal layer has a thickness twice or greater than the maximum height from the exposed surface of the first semiconductor layer 12a to the surface of the insulating layer 15b. Next, as shown in FIG. 7H, the upper surface of the metal layer is flattened by way of CMP treatment or polishing, thus the first electrode 13 is formed. In the present embodiment, the term "flat" indicates that the maximum difference in height in the surface with respect to standard plane is ±50 nm. In the present embodiment, flattening is performed so that the insulating layer 15b is not exposed from the flattened surface (the bottom surface of the first electrode 13). The metal layer is inevitably formed along the contour of the opening of the through-holes 13b, but by flattening the surface by polishing or the like can prevent generation of voids between the first electrode-side bonding layer 13a and the support substrate-side bonding layer 19 in the bonding step to be performed later. In the present embodiment, a member which is connected to the first semiconductor layer 12a and which includes a flattened metal layer is indicated as the first electrode 13.

<Formation of First Electrode-Side Bonding Layer 13a>

Figure 7I:
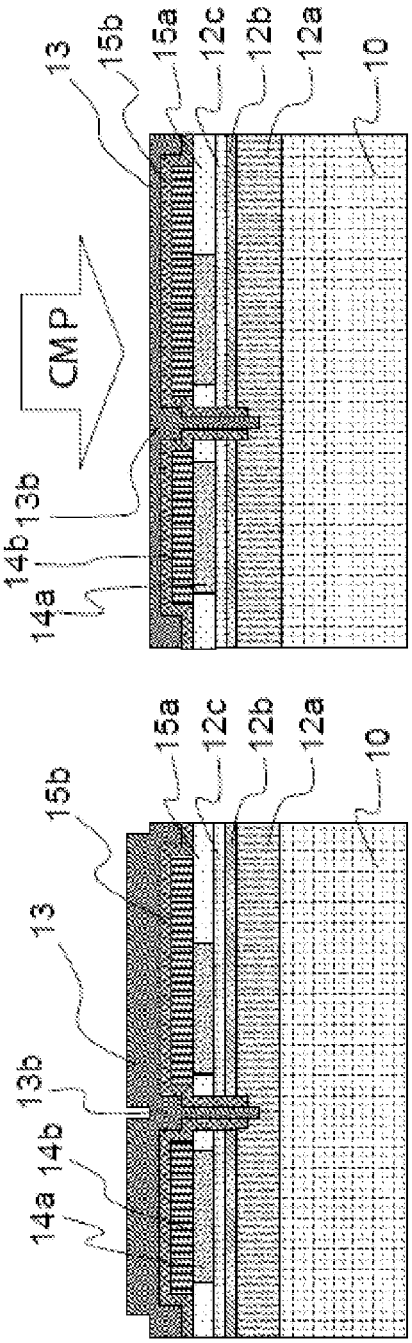

On the first electrode 13, a first electrode-side bonding layer 13a is formed for bonding to the support substrate-side bonding layer 19 at the time of bonding, as shown in FIG. 7I. The surface of the first electrode 13 is flat, so that the first electrode-side bonding layer 13a which is formed on the first electrode 13 also becomes flat.

<Bonding Step>

Figure 7J:
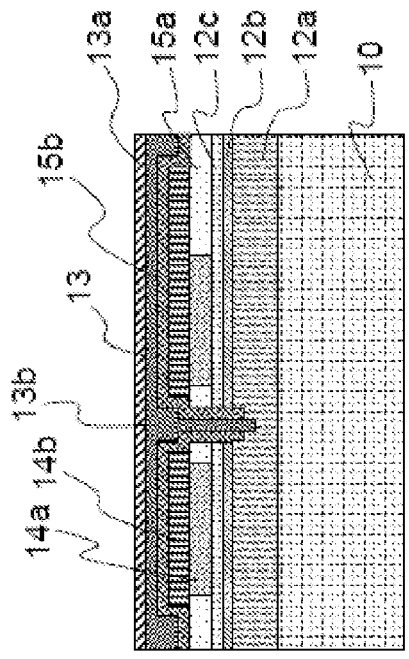
Figure 8K:
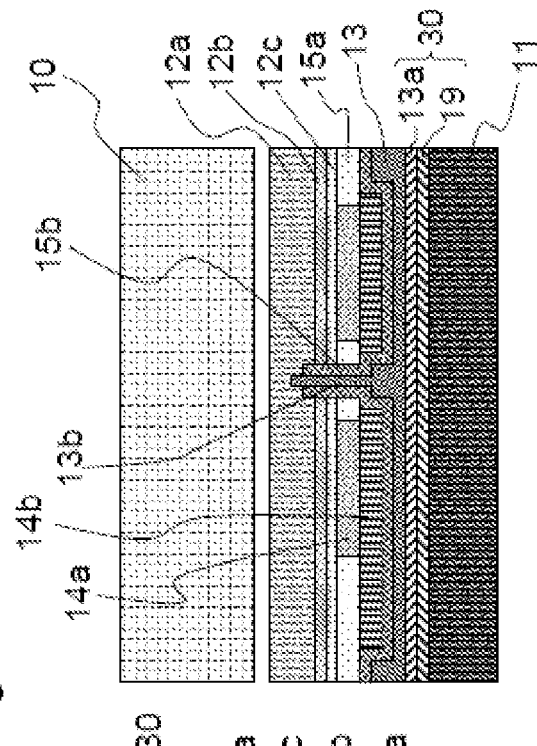
FIG. 8K to FIG. 8N are schematic diagrams illustrating a process of a method of manufacturing a semiconductor light emitting element according to a first embodiment.

Meanwhile, the support substrate 11 including the support substrate-side bonding layer 19 formed thereon is prepared, as shown in FIG. 7J. If the upper surface of the support substrate 11 is flat, flattening treatment on the support substrate-side bonding layer 19 is not necessary, but a flattened layer may be provided in the stacked layer structure of the support substrate-side bonding layer 19 so that the top surface of the support substrate-side bonding layer 19 becomes flat. Next, as shown in FIG. 8K, the support substrate-side bonding layer 19 and the first electrode-side bonding layer 13a are bonded by way of thermal compression to form the bonding layer 30. At this time, a part of materials constituting the support substrate-side bonding layer 19 and the first electrode-side bonding layer 13a may be alloyed, or the components of the materials may be diffused into each other.

<Element Singulation (Formation of Semiconductor Stacked Layer Unit 12)>

Figure 8L:
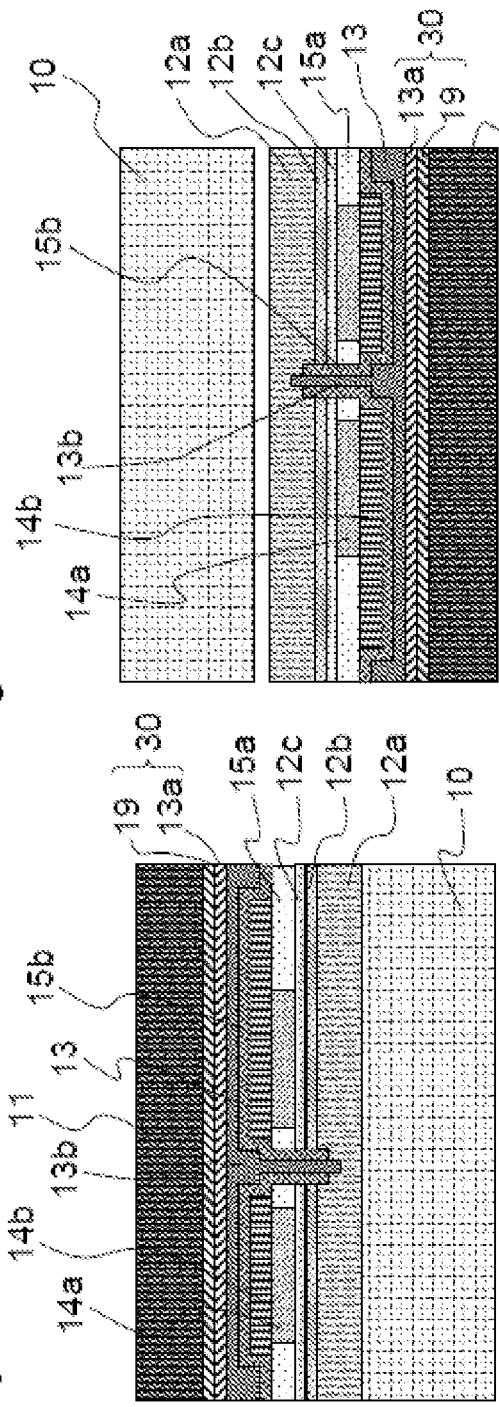
Figure 8M:
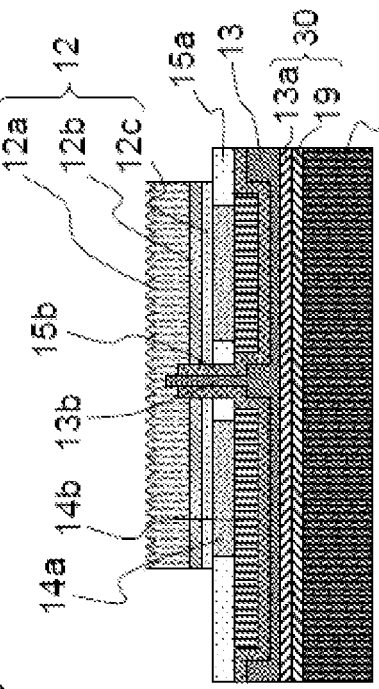
Figure 8N:
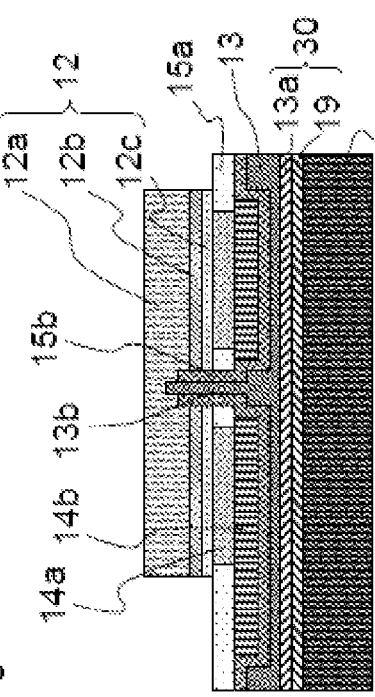

The growth substrate 10 on the first semiconductor layer 12a may be removed, as shown in FIG. 8L, by laser irradiation from the growth substrate 10 side, using a solid-state laser such as excimer laser or femtosecond laser (LLO: laser lift off) or by grinding. After the growth substrate 10 is removed, the surface of the exposed first semiconductor layer 12a may be treated by using CMP method to expose the desired layer of the first semiconductor layer 12a. Then, as shown in FIG. 8M, a resist is disposed on the upper surface of the first semiconductor layer 12a and etching is carried out by way of RIE etc., to form the semiconductor stacked layer unit 12 which are respectively a constituting component of individual semiconductor light emitting elements 100. The upper surface of the semiconductor stacked layer unit 12 is subjected to anisotropic etching with a TMAH (tetramethylammonium hydroxide) solution, as shown in FIG. 8N. With this treatment, the surface of the first semiconductor layer 12a becomes an irregular surface, which contributes to improvement of the light extracting efficiency.

<Formation of Pad Electrode 14c>

Figure 9O:
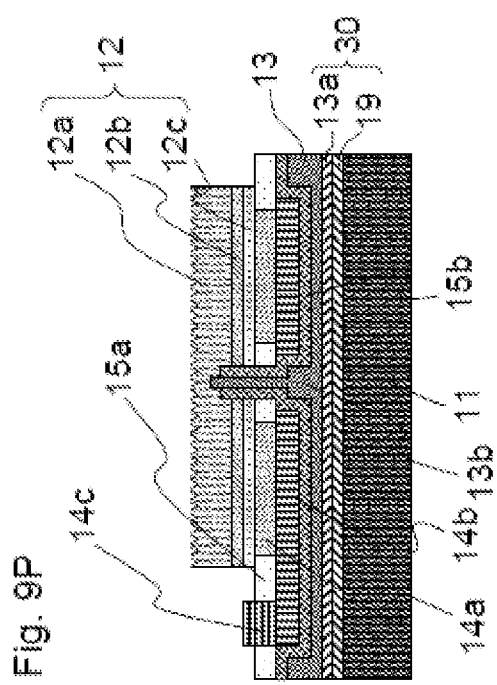
FIG. 9O to FIG. 9R are schematic diagrams illustrating a process of a method of manufacturing a semiconductor light emitting element according to a first embodiment.
Figure 9P:
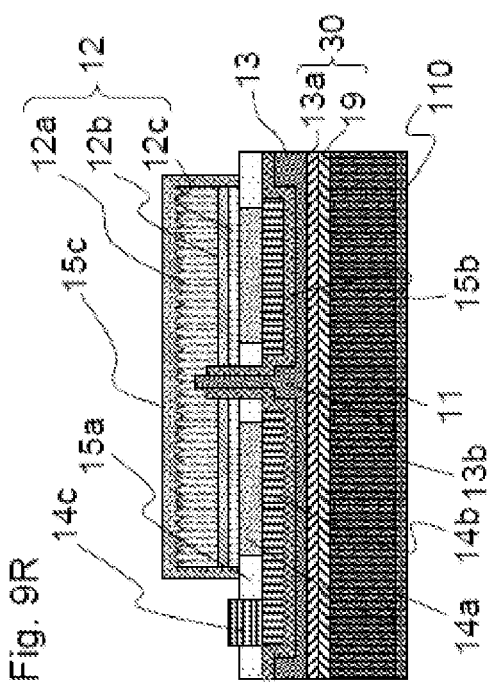

A part of the protective layer 15a exposed from the semiconductor stacked layer unit 12 in plan view is removed to create an opening, as shown in FIG. 9O, and a pad electrode 14c is formed in the opening, as shown in FIG. 9P.

<Formation of Protective Layer 15c and Backside Bonding Layer 110>

Figure 9Q:
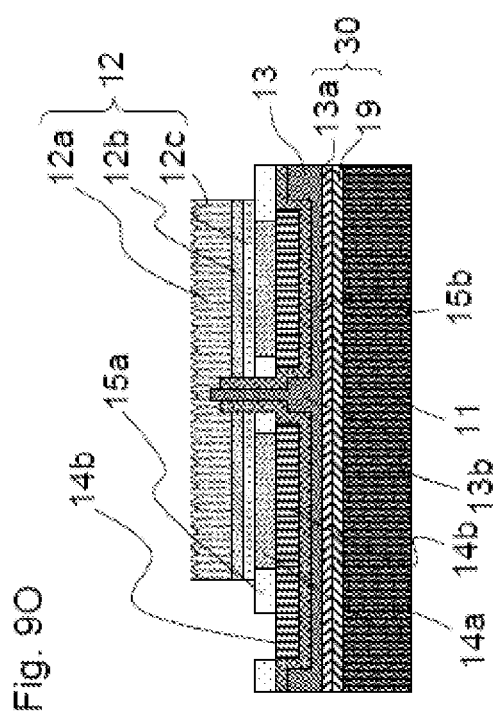
Figure 9R:
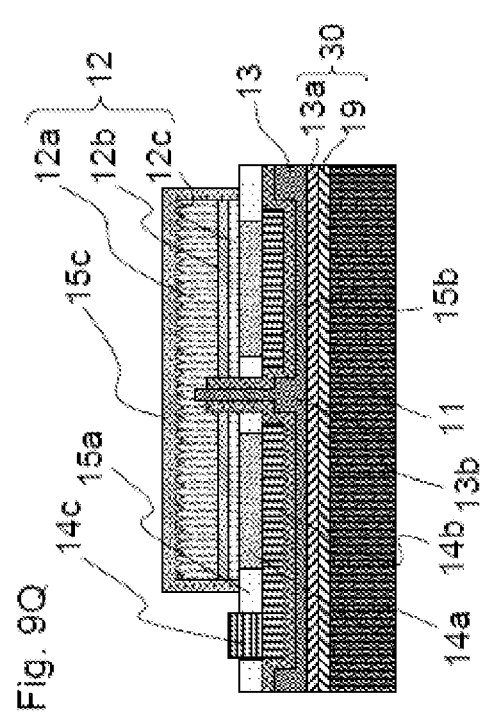

The protective layer 15c to cover the upper surface and the side surfaces of the semiconductor stacked layer unit 12 is formed, as shown in FIG. 9Q. Also, as shown in FIG. 9R, on substantially the entire back surface of the support substrate, a backside bonding layer 110 is formed to mount the semiconductor light emitting element 100 on the mounting substrate. Then, the wafer is divided into individual semiconductor light emitting elements 100 by way of dicing, breaking, or the like. According to the method described above, the semiconductor light emitting elements 100 of the first embodiment may be manufactured.

<Formation of Bump 17 and Wavelength Converting Member 18>

A variant example of a process of a method of manufacturing a semiconductor light emitting element according to a first embodiment is shown in FIG. 10A to FIG. 10C. As shown in FIG. 10A, semiconductor light emitting elements 1000 may be manufactured by performing the steps described below before dividing the wafer into individual semiconductor light emitting elements 100 by dicing or breaking. On the pad electrode 14c, a bump 17 is formed with a height greater then the height of the semiconductor stacked layer unit 12. All of the exposed surfaces of the pad electrode 14c, the protective layer 15a, the protective layer 15c, and the bump 17 are covered with a wavelength converting member 18 made of a resin which contains a fluorescent material. The wavelength converting member 18 is applied on the wafer by using printing, potting, compression molding, spin coating, spray coating or the like as shown in FIG. 10B. The resin of the wavelength converting member 18 is cured, then, as shown in FIG. 10C, grinding is carried out to expose the upper surface of the bump 17 so that the upper surfaces of the bump 17 and the wavelength converting member 18 become approximately the same height. Then, the wafer is divided into individual semiconductor light emitting elements 1000 by way of dicing, breaking, or the like. According to the method described above, the semiconductor light emitting elements 1000 of a variant example of the first embodiment may be manufactured.

EXAMPLES

Example 1

Next, Example 1 will be described below. In Example 1, a semiconductor light emitting element 100 is manufactured based on the method of manufacturing the semiconductor light emitting element according to the first embodiment. FIG. 1 is a schematic plan view showing a semiconductor light emitting element according to Example 1. FIG. 2 is a schematic cross-sectional view taken along line I-I' of FIG. 1, of a semiconductor light emitting element according to the Example 1. FIG. 3 is a schematic plan view taken along line II-II' of FIG. 2 (protective layer 15c is not shown) showing a semiconductor light emitting element according to Example 1. The lines I-I' shown in FIG. 1 and FIG. 3 indicate the same line. FIG. 4 is a partially enlarged view of FIG. 2, showing a schematic cross-sectional view of a semiconductor light emitting element according to Example 1.

In the present embodiment, the stacked layer structure is described so that the components located lower portion in the cross-sectional view are described from the left side. For example, in the case where Au, Pt, and Ti are stacked in this order from the lower portion in the figure, the stacked layer structure will be described as Au/Pt/Ti.

The semiconductor light emitting element 100 of Example 1 has a dimension of 2 mm square in a plan view. The light emitting element 100 may includes a support substrate 11, a bonding layer 30 disposed on the support substrate 11, an n-side electrode 13 disposed on the bonding layer 30, and a semiconductor stacked layer unit 12 disposed on the n-side electrode 13. Further, the bonding layer 30 may include an n-side electrode-side bonding layer 13a and a support substrate-side bonding layer 19, and the semiconductor stacked layer unit 12 may include an n-type semiconductor layer 12a, a light emitting layer 12b, and a p-type semiconductor layer 12c. Between the n-side electrode 13 and the semiconductor stacked layer unit 12, a protective layer 15a, an insulating layer 15b, and a p-side electrode 14 which includes a reflective electrode 14a, a wiring electrode 14b, and a pad electrode 14c are disposed.

The semiconductor light emitting element 100 of Example 1 includes a support substrate-side bonding layer 19 made of Ti/Pt/Au (2 nm/300 nm/500 nm) and an n-side electrode-side bonding layer 13a made of Au/Pt/Ti (500 nm/300 nm/100 nm) in this order on a Si substrate 11 having a rectangular shape in plan view and includes a backside bonding layer 110 made of Au/Pt/Ti (500 nm/300 nm/2 nm) on its bottom surface. Then, a bonding layer 30 including an Au layer which contains Au of the support substrate-side bonding layer 19 and Au of the n-side electrode-side bonding layer 13a. On approximately the entire surface of the n-side electrode-side bonding layer 13a, an n-side electrode 13 made of an AlCu alloy and having a flat bottom surface is formed. In the bonding layer 30, the Au layer includes a plurality of gaps aligning approximately in parallel to the bottom surface of the n-side electrode 13. The gaps are smaller than 100 nm with irregular shapes and spaced at uneven intervals.

The n-side electrode 13 and the p-side electrode 14 each have, in a plan view, a region which overlaps with each other. The n-side electrode 13 is connected to the exposed n-type semiconductor layer 12a through the through-hole 13b which penetrates each of the wiring electrode 14b and the reflective electrode 14a of the p-side electrode 14, the p-type semiconductor 12c, the light emitting layer 12b, a part of the n-type semiconductor 12a. The n-side electrode 13 has a thickness of about 4 μm from the exposed surface of the n-type semiconductor layer 12a to the bottom surface of the n-side electrode 13 in the through-hole 13b, and about 1 μm in the region other than the through-hole 13b. The through-holes 13b are tapered from the p-type semiconductor layer 12c toward the n-type semiconductor layer 12a.

As the insulating layer 15b, a 1000 nm thickness of silicon oxide is disposed between the n-side electrode 13 and the p-side electrode 14. The insulating layer 15b is extended upwardly toward the upper surface of the semiconductor light emitting element 100, from below the p-side electrode 14 to cover the side surfaces of the p-side electrode 14 adjacent to the through-hole 13b and the p-type semiconductor layer 12c, the light emitting layer 12b, and a part of the n-type semiconductor layer 12a.

The p-side electrode 14 is disposed above the n-side electrode 13 via the insulating layer 15b. In the p-side electrode 14, the reflective electrode 14a of Pt/Ti/Ni/Ag (120 nm/120 nm/120 nm/120 nm) is disposed to cover approximately the entire surface of the p-type semiconductor layer 12c, and the exposed surface of the p-type semiconductor layer 12c is covered with the protective layer 15a made of silicon oxide with a thickness of 480 nm. The wiring electrode 14b of Ti/Rh/Ti (30 nm/340 nm/30 nm) is disposed to cover the reflective electrode 14a on the surface opposite to the surface which is in contact with the p-type semiconductor layer 12c of the reflective electrode 14a. The wiring electrode 14b is extended to be exposed from the semiconductor stacked layer unit 12 in a planar view, that is, the wiring electrode 14b is extended to a region so as not to overlap with the semiconductor stacked layer unit 12. A pad electrode 14c of Ti/Pt/Au (30 nm/300 nm/500 nm) is formed on the wiring electrode 14b exposed from the semiconductor stacked layer 12. The pad electrode 14c is disposed in a region which does not overlap the semiconductor stacked layer unit 12 in a plan view. Two pad electrodes 14c are disposed on a rectangular semiconductor light emitting element 100 each at about the center of a side at opposite peripheral portions of the semiconductor light emitting element 100.

The semiconductor stacked layer unit 12 is located on the p-side electrode 14. The semiconductor stacked layer unit 12 includes from the upper surface side (opposite side of the Si substrate), an n-type semiconductor layer 12a, a light emitting layer 12b having a multi quantum well structure, and a p-type semiconductor layer 12c. The semiconductor stacked layer unit 12 has the n-type semiconductor layer 12a whose upper surface has a rough surface or an irregular shape. Also, the p-type semiconductor layer 12c and the light emitting layer 12b are partially removed to expose the n-type semiconductor layer 12a. The n-type semiconductor layer unit 12a is exposed in a plurality of regions respectively in an approximately elliptical shape, and the plurality of exposed regions are created in a matrix at regular intervals on approximately the entire upper surface of the semiconductor stacked layer unit 12 to expose the first semiconductor layer 12a. Each of the exposed n-type semiconductor layers 12a is connected to the n-side electrode 13 via the through-hole 13b. The side surfaces and the upper surface of the semiconductor stacked layer unit 12 are covered with the protective layer 15c made of a silicon oxide with a thickness of 400 nm.

The semiconductor light emitting element 100 according to Example 1 may be fabricated according to the method of manufacturing described below.

First, a sapphire substrate 10 which is a growth substrate having an irregular surface was placed in a MOCVD chamber, and on the sapphire substrate 10, a GaN layer which is an undoped nitride semiconductor was grown as the buffer layer. As the n-type contact layer, a Si-doped n-type GaN layer, and further, a GaN layer which is an undoped nitride semiconductor were stacked to form an n-type semiconductor layer 12a. On the n-type semiconductor layer 12a, as a light emitting layer 12b, a single set of a GaN layer to be a barrier layer and an InGaN layer to be a well layer were stacked nine times and a final layer of a GaN layer to be a barrier layer was stacked to form a multi quantum well structure. On the light emitting layer 12b, as a p-type semiconductor layer 12c, a Mg-doped p-type cladding layer of AlGaN layer and a Mg-doped p-type contact layer of p-type GaN layer were stacked in this order. According to the steps described above, a wafer having a semiconductor stacked layer structure to be the semiconductor stacked layer units 12 was obtained.

The reflective electrode 14a having holes for the through-holes 13b was formed in a pattern by stacking Ag/Ni/Ti/Pt in this order on approximately the entire surface of the p-type semiconductor layer 12c. The protective layer 15a made of silicon oxide was formed on the p-type semiconductor layer 12c exposed from the reflective electrode 14a. Then, on approximately the entire surfaces of the reflective electrode 14a and the protective layer 15a, the wiring electrode 14b was formed in sequence of Ti/Rh/Ti so that the holes of the reflective electrode 14a were also in conformity to the through-holes 13b as in the reflective electrode 14a.

Next, the protective layer 15a, the p-type semiconductor layer 12c, the light emitting layer 12b, and a part of the n-type semiconductor layer 12a were removed to partially expose the n-type semiconductor layer 12a, thus each through hole 13b was formed.

The insulating layer 15b which covers all the wiring electrode 14b, the protective layer 15a, and the portions of the p-type semiconductor layer 12c, the light emitting layer 12b, and the n-type semiconductor layer 12a defining the through-holes 13b was formed with a 1000 nm thickness of silicon oxide. With the insulating layer 15b, the n-side electrode is insulated from the p-side electrode, the p-type semiconductor layer 12c, and the light emitting layer 12b. Then, parts of the insulating layer 15b in the regions to be the through-holes 13b were removed by way of etching to expose the n-type semiconductor layer 12a.

On the insulating layer 15b, a metal layer which encloses the through-holes 13b and was in contact with the exposed surface portions of the n-type semiconductor layer 12a was formed by stacking an AlCu alloy. At this time, the step difference in the surface of the metal layer was at most 4.3 μm. Then, a CMP treatment was performed on the upper surface of the metal layer to reduce the step difference of the metal layer to less than 50 nm, thus, the n-side electrode 13 was formed. On the flattened n-side electrode 13, the n-side electrode bonding layer 13a for bonging to the support substrate-side bonding layer at the bonding, was formed by stacking Ti/Pt/Au in this order.

Meanwhile, the support substrate 11 having the support substrate-side bonding layer 19 made by stacking Ti/Pt/Au was prepared, and the support substrate-side bonding layer 19 and the n-side electrode-side bonding layer 13a are bonded by way of thermal compression to form the bonding layer 30. With this, an Au—Au bonding layer 30 was formed.

The sapphire substrate 10 on the n-type semiconductor layer 12a was removed by performing LLO from the sapphire substrate 10 side. After removing the sapphire substrate 10, a CMP treatment was performed on the surface of the exposed n-type semiconductor layer 12a to expose an appropriate layer of the n-type semiconductor layer 12a. Then, a resist was disposed on the upper surface of the n-type semiconductor layer 12a and etching was carried out by way of RIE etc., to form the semiconductor stacked layer units 12 which were respectively a constituting component of individual semiconductor light emitting elements 100. The upper surface of the n-type semiconductor layer 12a was subjected to anisotropic etching by using a TMAH solution to obtain a rough surface.

A part of the protective layer 15a exposed from the semiconductor stacked layer unit 12 in plan view was removed by etching to form an opening and the pad electrode 14c of Ti/Pt/Au was formed on the wiring electrode 14b in the opening of the protective layer 15a.

The protective layer 15c to cover the upper surface and the side surfaces of the semiconductor stacked layer unit 12 was formed by silicon oxide with a thickness of 400 nm. Further, Ti/Pt/Au was stacked in this order on the entire back surface of the support substrate to form the backside bonding layer 110. Using dicing or breaking at predetermined locations, the wafer obtained by a method described above was divided into individual units to form semiconductor light emitting elements 100 with a size of 2 mm square.

Figure 11:
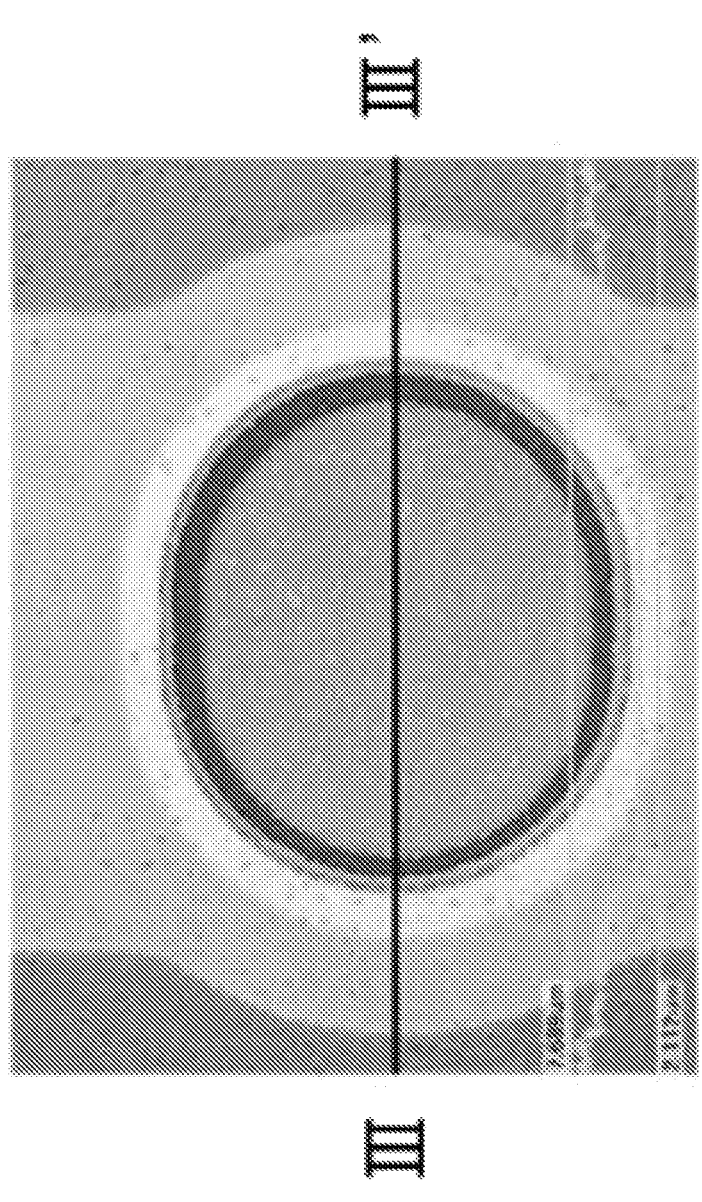
FIG. 11 is an image diagram illustrating a measurement result of step difference of metal layer at a through-hole portion which is measured a top surface side of the metal layer by using a laser microscope in a semiconductor light emitting element according to Example 1.
Figure 12:
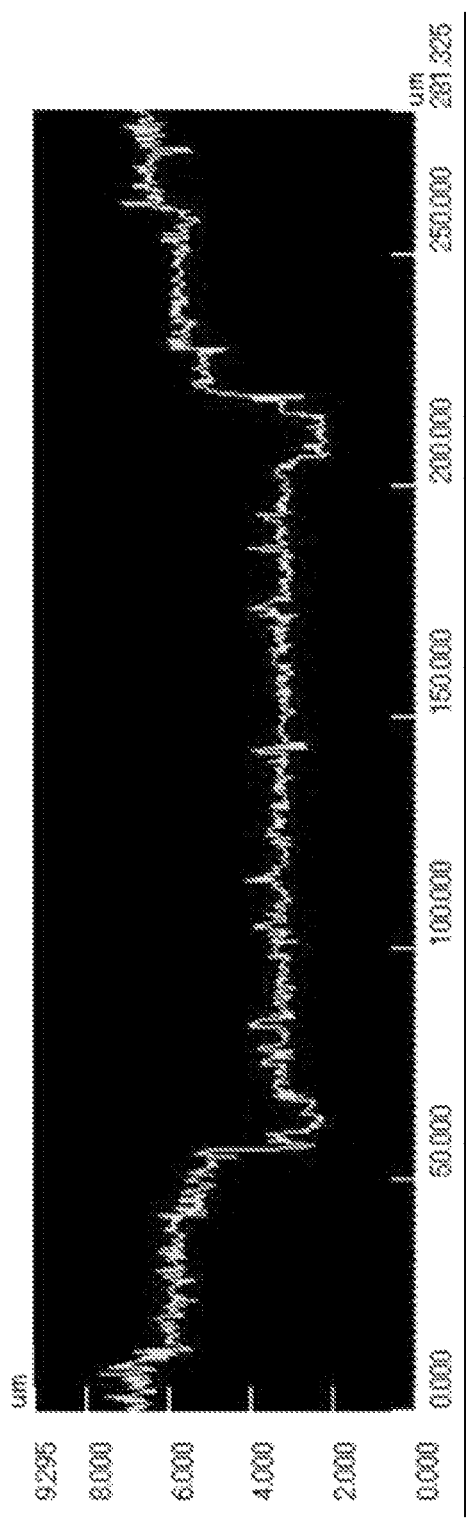
FIG. 12 is a graph showing a measurement result of step differences of the metal layer at the III-III' line in FIG. 11, measured from the metal layer surface side by using a laser microscope.
Figure 13:
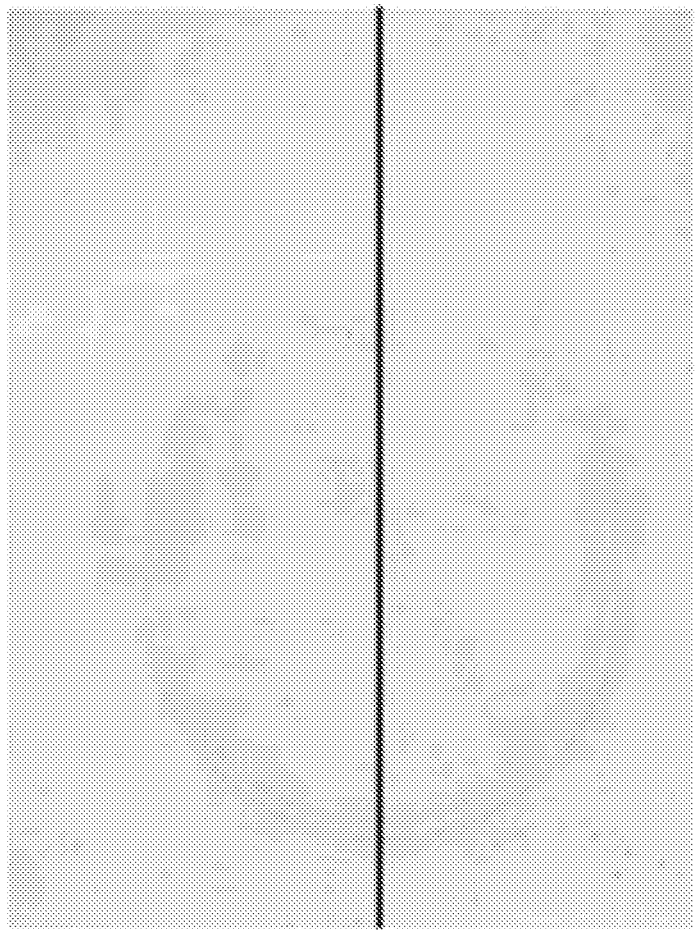
FIG. 13 is an image diagram illustrating a measurement result of step difference of first electrode at a through-hole portion which is measured a bottom surface side of the first electrode by using a laser microscope in a semiconductor light emitting element according to Example 1.
Figure 14:
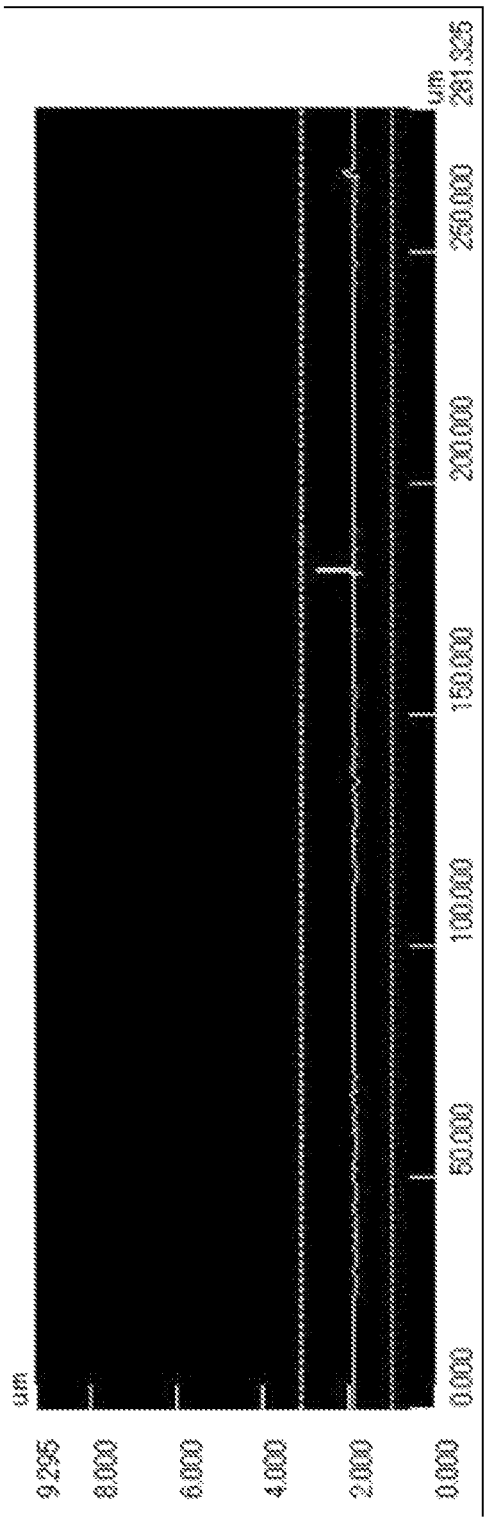
FIG. 14 is a graph showing a measurement result of step differences of the first electrode at the IV-IV' line in FIG. 13, measured from the bottom surface side of the first electrode by using a laser microscope.
Figure 15:
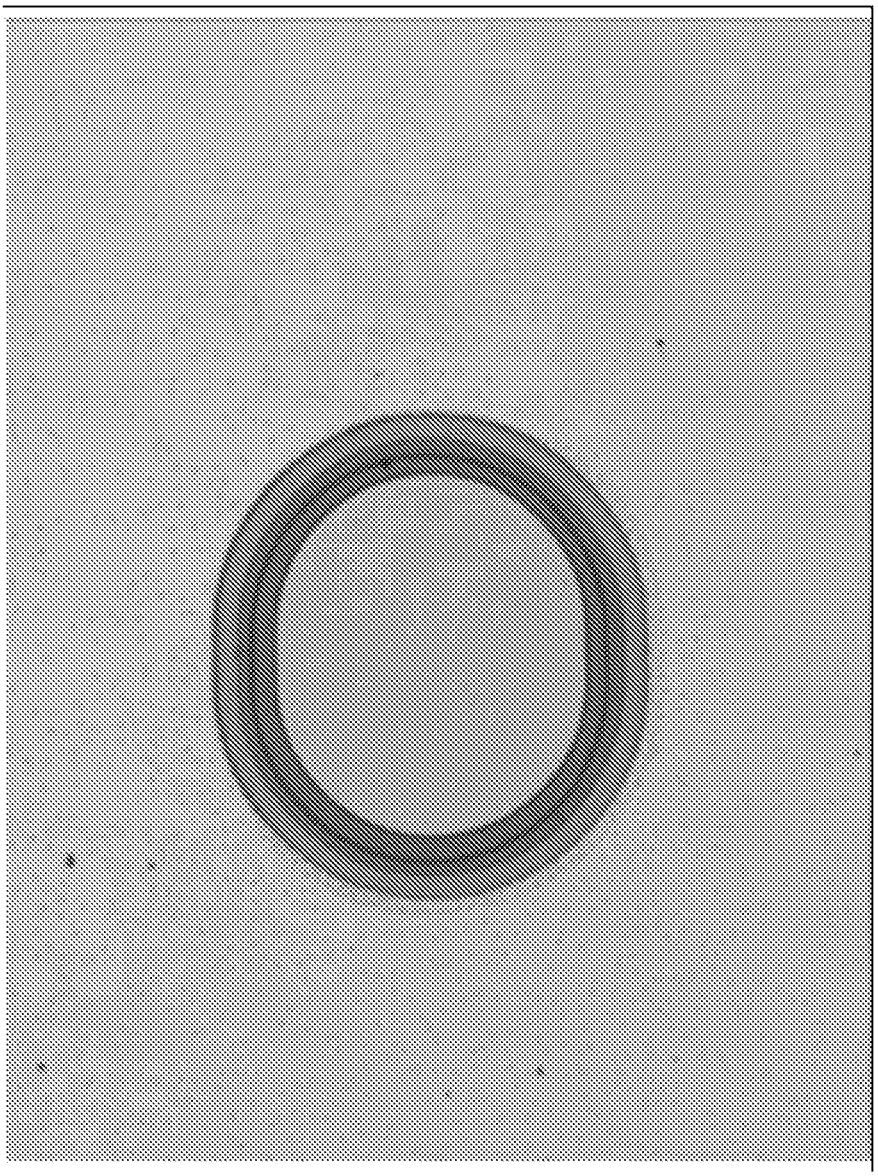
FIG. 15 is an image diagram showing an optical microscope picture of a semiconductor stacked layer at a through-hole portion, after forming the bonding layer and removing the growth substrate, in a semiconductor light emitting element according to Example 1.
Figure 16:
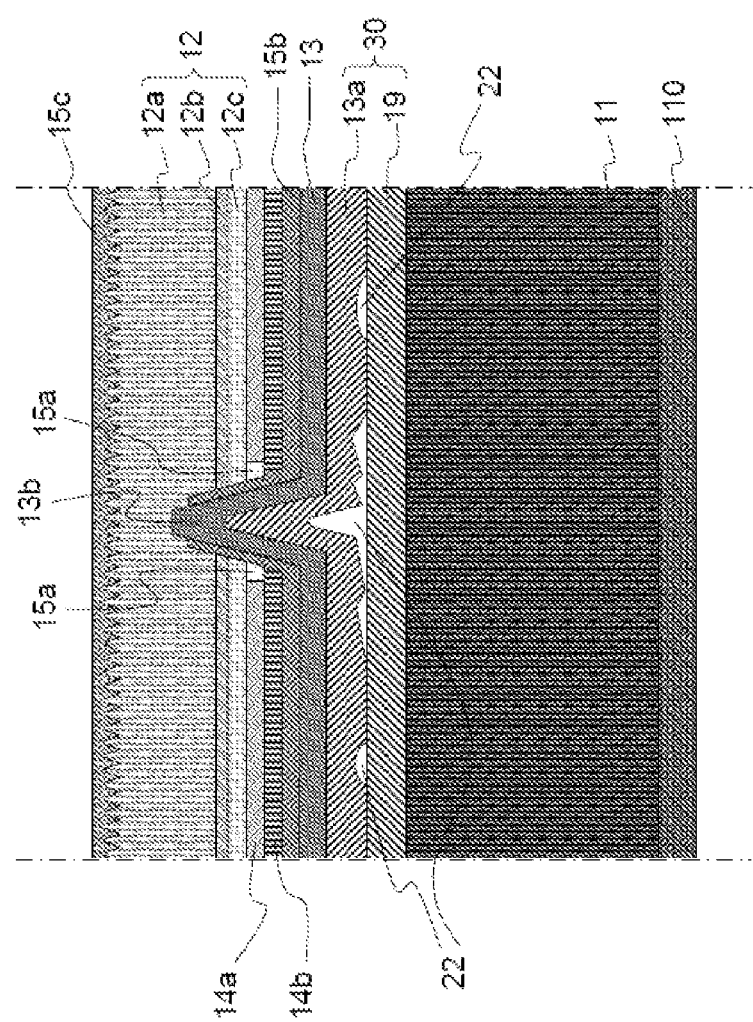
FIG. 16 is a schematic cross-sectional view showing voids in the bonding layer at a through-hole portion after forming the bonding layer and removing the growth substrate, in a semiconductor light emitting element according to Comparative Example 1.
Figure 17:
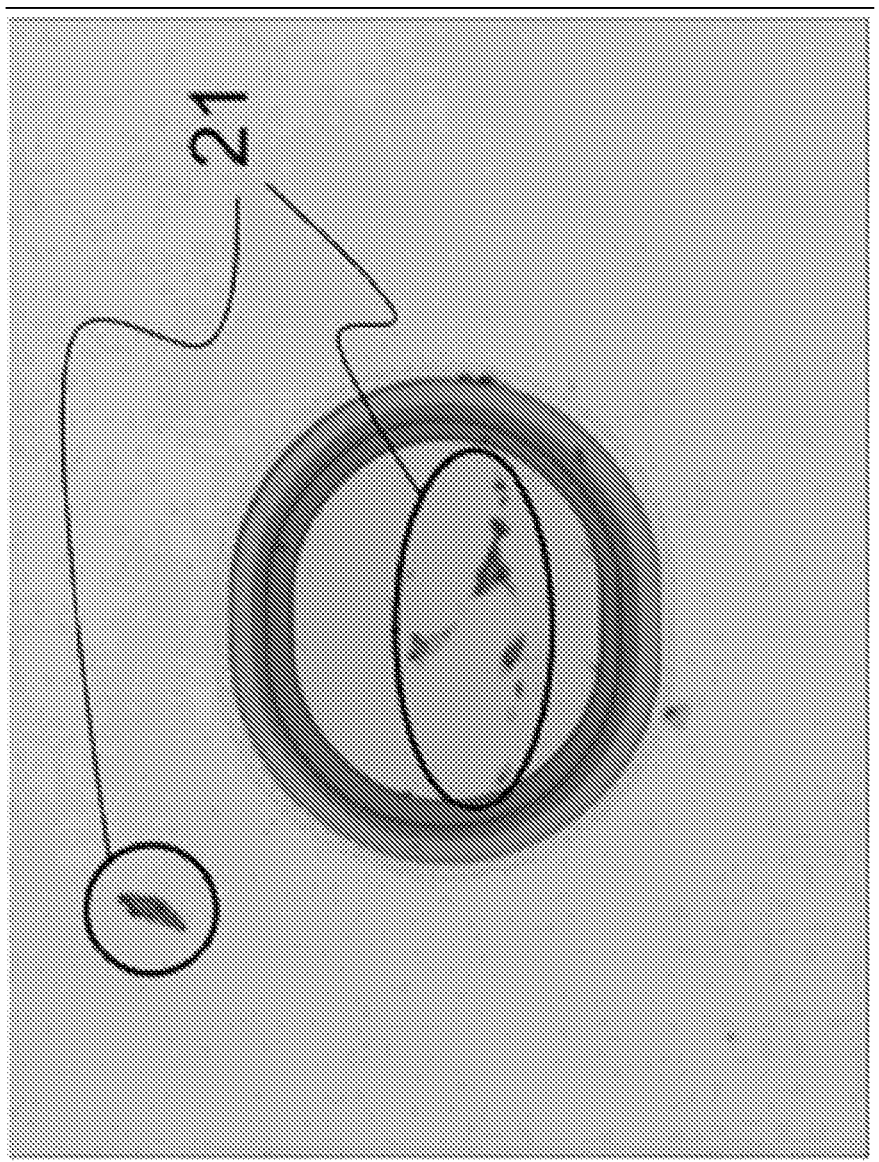
FIG. 17 is an image diagram showing an optical microscope picture of a semiconductor stacked layer at a through-hole portion which is after forming the bonding layer and removing the growth substrate, in a semiconductor light emitting element according to Comparative Example 1.

The semiconductor light emitting elements 100 according to Example 1, fabricated as described above, were compared with that obtained in Comparative Example 1, to evaluate that the gaps 20 in the bonding layer 30 in the semiconductor light emitting elements 100 do not damage the semiconductor stacked layer unit 12. FIG. 11 is an image diagram of a semiconductor light emitting element according to Example 1, illustrating a measurement result of step difference of metal layer at a through-hole portion which is measured a top surface side of the metal layer by using a laser microscope. FIG. 12 is a graph showing a measurement result of step differences of the metal layer at the III-III' line in FIG. 11, measured from the metal layer surface side by using a laser microscope. FIG. 13 is an image diagram of a semiconductor light emitting element according to Example 1, illustrating a measurement result of step difference of first electrode at a through-hole portion which is measured a bottom surface side of the first electrode by using a laser microscope. FIG. 14 is a graph showing a measurement result of step differences of the first electrode at the IV-IV' line in FIG. 13, measured from the bottom surface side of the first electrode by using a laser microscope. FIG. 15 is an image diagram of a semiconductor light emitting element according to Example 1, showing an optical microscope picture of a semiconductor stacked layer over a through-hole portion which is after the bonding layer and a growth substrate have been removed. FIG. 16 is a schematic cross-sectional view of a semiconductor light emitting element according to Comparative Example 1, showing voids in the bonding layer at a through-hole portion after forming the bonding layer and removing the growth substrate. FIG. 17 is an image diagram showing an optical microscope picture of a semiconductor stacked layer at a through-hole portion which is after forming the bonding layer and removing the growth substrate, in a semiconductor light emitting element according to Comparative Example 1.

Firstly, in the semiconductor light emitting element 100 of Example 1, the step difference in the surface of the metal layer at the through-holes 13b was measured by using a laser microscope (FIG. 11). As a result, it was confirmed that a maximum of 4.3 μm difference was observed at a portion along a line III-III' in FIG. 11 (FIG. 12). Then, the metal layer was flattened to reduce the vertical difference in the surface of the metal layer to less than ±50 nm to form the n-side electrode 13 (FIG. 13). As a result, it was confirmed that the step difference is leveled out at a portion along a line IV-IV' in FIG. 13 (FIG. 14). Further, the light emitting elements in which step differences were leveled out before the n-side electrode bonding layer 13a and the support substrate-side bonding layer 19 were bonded, then the sapphire substrate was removed by using LLO include a plurality of gaps aligned approximately in parallel to the bottom surface of the n-side electrode in the bonding interface in the bonding layer 30, but a large void was not observed and a damage in the semiconductor stacked layer unit 12 on the through-holes 13b did not occur (FIG. 15). The sample shown in FIG. 15 was obtained by removing the sapphire substrate by using LLO then about 1 μm of CMP treatment was performed to make the surface of the semiconductor stacked layer unit 12 with a mirror surface.

On the other hand, as Comparative Example 1, the sample was fabricated in a similar manner as in Example 1 except that the n-side electrode bonding layer 13b was formed on the metal layer without a flattening treatment after forming the metal layer, then bonded with the support substrate-side bonding layer 19. For Comparative Example 1, the sample was also processed by removing the sapphire substrate by using LLO then about 1 μm of CMP treatment was performed to make the surface of the semiconductor stacked layer unit 12 with a mirror surface. The result showed that voids occurred in the bonding interface in the bonding layer 30. Particularly, large voids with a shape which is in conformity (similar shapes) to the shapes of the through-hole 13b and the n-side electrode 13 occurred directly under the through-holes 13b (FIG. 16). The size of those voids exceed 100 nm in the stacking direction of the semiconductor stacked layer unit 12, with the heights reaching the bottom surface of the n-side electrode 13, and a number of damages (cracks 21) occurred in the semiconductor stacked layer unit 12 on the through-holes 13b (FIG. 17).

As described above, forming a first electrode having flattened bottom surface and bonding a first electrode-side bonding layer having a surface state where the step difference was leveled off with the support substrate-side bonding layer, occurrence of voids can be prevented and damage on the semiconductor stacked layer unit 12 can be prevented. Also, providing an Au layer having an Au—Au bonding allows obtaining of the semiconductor light emitting elements of high reliability.

INDUSTRIAL APPLICABILITY

The semiconductor light emitting element according to the present invention can be applied to illumination light sources, light sources for various kinds of indicators, light sources for automobile use, light sources for displays, back light sources for liquid crystal displays, light sources for sensors, signals, and so on.

What is claimed is:

1. A method of manufacturing a semiconductor light emitting element comprising:
    preparing a semiconductor stacked layer structure by stacking a first semiconductor layer and a second semiconductor layer in this order;
    forming portions of a second electrode on the second semiconductor layer;
    exposing the first semiconductor layer by removing a part of the second semiconductor layer;
    forming an insulating layer on the portions of the second electrode;
    forming a first electrode by forming a metal layer on the exposed first semiconductor layer and the insulating layer, and flattening a surface of the metal layer;
    on the first electrode, forming a first electrode-side bonding layer having a top layer made of Au;
    preparing a support substrate comprising a support substrate-side bonding layer having a top surface made of Au; and
    bonding the first electrode-side bonding layer and the support substrate-side bonding layer.

2. The method of manufacturing a semiconductor light emitting element according to claim 1, wherein the first electrode comprises an alloy comprising Al.

3. The method of manufacturing a semiconductor light emitting element according to claim 1, wherein the first electrode comprises an AlCu alloy.

4. The method of manufacturing a semiconductor light emitting element according to claim 1, wherein the first electrode has a thickness of 3 μm or greater and 10 μm or less from the exposed surface of the first semiconductor layer to the bottom surface of the first electrode.

5. The method of manufacturing a semiconductor light emitting element according to claim 1, wherein flattening a surface of the metal layer to form the first electrode is performed by using a chemical mechanical polishing technology.

* * * * *